(12) United States Patent
Kaneko et al.

(10) Patent No.: US 8,610,287 B2
(45) Date of Patent: Dec. 17, 2013

(54) WIRING SUBSTRATE AND METHOD OF MANUFACTURING THE SAME

(75) Inventors: Kentaro Kaneko, Nagano (JP); Kotaro Kodani, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 114 days.

(21) Appl. No.: 12/967,322

(22) Filed: Dec. 14, 2010

(65) Prior Publication Data

US 2011/0147924 A1     Jun. 23, 2011

(30) Foreign Application Priority Data

Dec. 21, 2009  (JP) ................................. 2009-288983

(51) Int. Cl.
*H01L 23/48* (2006.01)
*H01L 23/52* (2006.01)
*H01L 29/40* (2006.01)

(52) U.S. Cl.
USPC .................................. 257/775; 257/E23.145

(58) Field of Classification Search
USPC .......... 257/737, 741, 769, 770, 774, E21.477, 257/E23.145, 678, 750, 775, E21.503, 257/E23.004, E23.067, E23.069; 438/667
See application file for complete search history.

(56) References Cited

U.S. PATENT DOCUMENTS

| | | | |
|---|---|---|---|
| 2003/0045024 A1* | 3/2003 | Shimoto et al. | 257/678 |
| 2003/0155638 A1* | 8/2003 | Ito | 257/678 |
| 2006/0145363 A1* | 7/2006 | Ikenaga et al. | 257/787 |
| 2006/0270211 A1 | 11/2006 | Nakamura | |
| 2007/0272938 A1* | 11/2007 | Maeda et al. | 257/99 |
| 2008/0149383 A1* | 6/2008 | Kaneko et al. | 174/262 |
| 2008/0179740 A1* | 7/2008 | Liao | 257/738 |
| 2008/0246146 A1* | 10/2008 | Kodani et al. | 257/737 |
| 2009/0065921 A1* | 3/2009 | Yamazaki et al. | 257/686 |

FOREIGN PATENT DOCUMENTS

| | | |
|---|---|---|
| JP | 2005-244108 A1 | 9/2005 |
| JP | 2007-13092 A1 | 1/2007 |

* cited by examiner

*Primary Examiner* — Daniel Luke
*Assistant Examiner* — Khaja Ahmad
(74) *Attorney, Agent, or Firm* — Kratz, Quintos & Hanson, LLP

(57) ABSTRACT

A wiring substrate includes an insulating layer, a wiring layer buried in the insulating layer, and a connection pad connected to the wiring layer via a via conductor provided in the insulating layer and in which at least a part is buried in an outer surface side of the insulating layer, wherein the connection pad includes a first metal layer (a first copper layer) arranged on the outer surface side, an intermediate metal layer (a nickel layer) arranged on a surface of an inner layer side of the first metal layer, and a second metal layer (a second copper layer) arranged on a surface of an inner layer side of the intermediate metal layer, and a hardness of the intermediate metal layer is higher than a hardness of the first metal layer and the second metal layer.

8 Claims, 19 Drawing Sheets preventing of crack progress

WIRING SUBSTRATE AND METHOD OF MANUFACTURING THE SAME

CROSS-REFERENCE TO RELATED APPLICATIONS

This application is based upon and claims the benefit of priority of the prior Japanese Patent Application No. 2009-288983, filed on Dec. 21, 2009; the entire contents of which are incorporated herein by reference.

FIELD

It is related to a wiring substrate and a method of manufacturing the same.

BACKGROUND

In the prior art, there is the wiring substrate which is applied as the semiconductor package for mounting the semiconductor chip. Such wiring substrate is manufactured based on laminating the wiring layers on the substrate by means of the build-up method.

In Patent Literature 1 (Japanese Laid-open Patent Publication No. 2005-244108), it is set forth that, in the wiring substrate which has the pads in the openings of the dielectric layer on its surface, the wall surface conductor portion which is formed from the outer edge of the pad main body to the inner layer direction, along the wall of the opening portion, is provided on the back surface side of the pad, thereby the crack which is generated from the boundary between the pad and the dielectric layer as the starting point should be prevented.

In Patent Literature 2 (Japanese Laid-open Patent Publication No. 2007-13092), it is set forth that the wiring substrate is obtained by forming to laminate the electrodes and the wiring portions connected thereto on the supporting substrate, and then removing the supporting substrate.

As explained in the column of the related art described later, the connection pads (copper pad) of the wiring substrate on which the semiconductor chip is mounted are mounted on the mounting substrate via the solder bumps, and thus the electronic component module is constructed. In such electronic component module, particularly in the case that the wiring substrate is the coreless type, when the drop test is performed as a reliability test, a crack is easily generated from the periphery of the connection pad to the inner layer side. Therefore, such a problem arises that sufficient reliability cannot be obtained in use.

SUMMARY

According to one aspect discussed herein, there is provided a wiring substrate, which includes an insulating layer, a wiring layer buried in the insulating layer, and a connection pad connected to the wiring layer via a via conductor provided in the insulating layer, and in which at least a part is buried in an outer surface side of the insulating layer, wherein the connection pad includes a first metal layer arranged on the outer surface side, an intermediate metal layer arranged on a surface of an inner layer side of the first metal layer, and a second metal layer arranged on a surface of an inner layer side of the intermediate metal layer, and a hardness of the intermediate metal layer is higher than a hardness of the first metal layer and the second metal layer.

According to another aspect discussed herein, there is provided a method of manufacturing a wiring substrate, which includes forming a resist in which an opening portion is provided, on a supporting substrate, forming a metal laminated portion including a first metal layer, an intermediate metal layer, and a second metal layer in sequence from a bottom, in the opening portion of the resist by an electroplating, such that a hardness of the intermediate metal layer is set higher than hardness of the first metal layer and the second metal layer, removing the resist, forming an insulating layer in which the metal laminated portion is buried, on the supporting substrate, forming a wiring layer connected to the second metal layer via a via conductor provided in the insulating layer, on the insulating layer, and obtaining a connection pad including the first metal layer, the intermediate metal layer, and the second metal layer by removing the supporting substrate.

DESCRIPTION OF EMBODIMENTS

Embodiments of the present invention will be explained with reference to the accompanying drawings hereinafter.

(Related Art)

Figure 1:
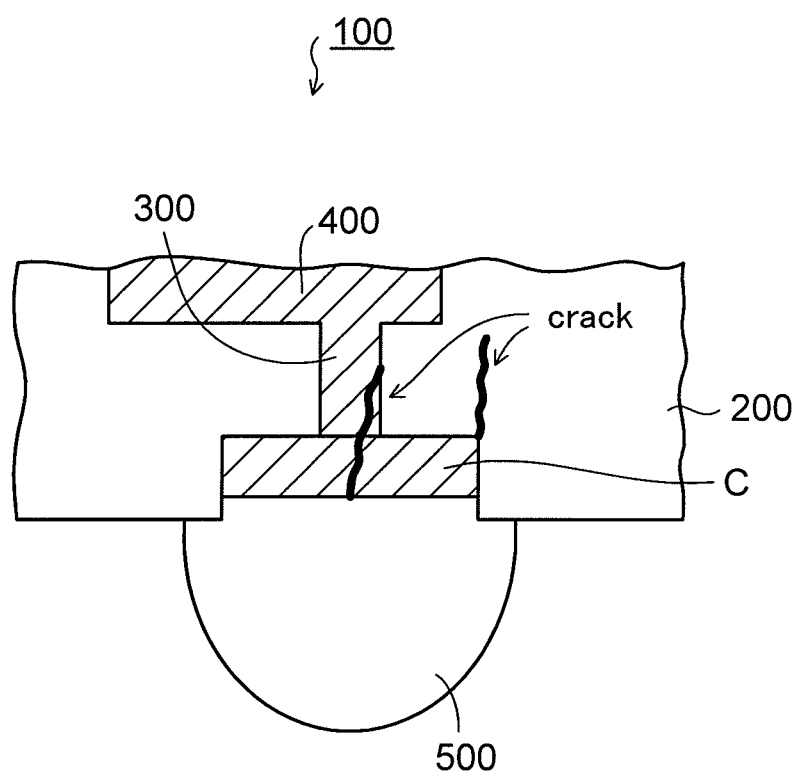
FIG. 1 is a sectional view depicting a wiring substrate in the related art.

Prior to the explanation of embodiments, the problem in the related art associated with the embodiment (preliminary matter) will be explained hereunder. FIG. 1 is a sectional view depicting a wiring substrate in the related art.

As depicted in FIG. 1, in a wiring substrate 100 in the related art, connection pads C are formed to be buried to the outer surface side of an insulating layer 200. The connection pad C is constructed by forming a contact layer made of nickel/gold layers, or the like to the outer layer side of a copper layer.

A via conductor 300 connected to the connection pad C is provided to the insulating layer 200 on the inner layer side of the connection pad C. A wiring layer 400 buried in the insulating layer 200 is formed to the inner layers side of the via conductor 300. In this manner, the connection pad C is connected to the wiring layer 400 via the via conductor 300.

Also, a solder bump 500 protruded outward is provided onto the connection pad C.

The wiring substrate 100 is the coreless wiring substrate which has no core substrate, and the insulating layer 200 functions as the substrate. The coreless wiring substrate is manufactured based on forming the build-up wiring including the connection pads on the supporting substrate, and then removing the supporting substrate. Therefore, the connection pad C of the wiring substrate 100 is formed in a state that such connection pad C is buried in the insulating layer 200.

In such wiring substrate 100, the semiconductor chip is mounted on the chip connection pads (not shown) on the opposite side to the connection pad C, and the solder bump 500 connected to the connection pad C is mounted to be connected to the connection electrode of the mounting substrate (the motherboard) (not shown). In this manner, the electronic component module is constructed by mounting the wiring substrate 100 on which the semiconductor chip is mounted on the mounting substrate.

In such electronic component module, the drop test is performed as a reliability test. That is, the electronic component module is dropped by predetermined number of times, and an accelerated deterioration test is performed to decide whether there are any troubles in the electrical connection between the wiring substrate 100 and the mounting substrate via the solder bump 500, or the like.

In the coreless type wiring substrate 100 which has the connection pad C whose major part is formed of the copper layer, such a problem exists that the crack is easily generated from the periphery of the connection pad C to the inner layer side.

That is, as depicted in FIG. 1, in some cases, the crack is generated from the boundary between the connection pad C and the insulating layer 200 to the insulating layer 200 on the inner layer side. Otherwise, the crack is generated in the connection pad C itself, and then in some cases, the crack progresses to the via conductor 300 on the inner layer side and its periphery.

This is caused by the following thing. This is, it influences that a thermal stress caused by the heating process when the solder bumps 500 of the wiring substrate 100 are reflow-soldered to the mounting substrate, or the like, and a stress concentration occurs to the periphery of the connection pad C and thus the crack is easily generated toward the inner layer side.

When the crack progresses from the periphery of the connection pad of the wiring substrate 100 to the inner layer side, it becomes a factor of a reduction in production yield and reliability of the electronic component module. Therefore, the wiring substrate having a new structure that is capable of preventing occurrence of the crack is desired.

First Embodiment

FIG. 2A to FIG. 4 are sectional views depicting a wiring substrate according to a first embodiment, and FIG. 5A to FIG. 10C are sectional views depicting a method of manufacturing the wiring substrate of the same.

Figure 2A:
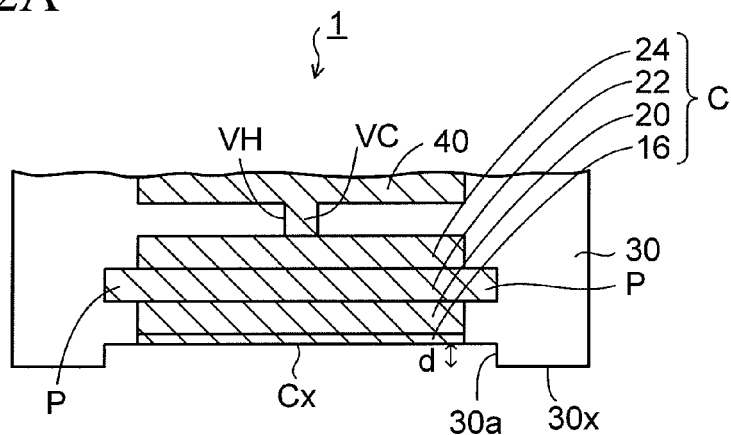
FIGS. 2A and 2B are sectional views depicting a wiring substrate according to a first embodiment.

As depicted in FIG. 2A, in a wiring substrate 1 of the first embodiment, a wiring layer 40 is formed to be buried in the inner layer side of an insulating layer 30. A via hole VH is provided in the insulating layer 30 on the outer layer side of the wiring layer 40, and a via conductor VC connected to the wiring layer 40 is filled in the via hole VH.

Also, the connection pad C is buried in the insulating layer 30 on the outer layer side of the via conductor VC, and the connection pad C is connected to the via conductor VC. In this manner, the connection pad C is connected to the wiring layer 40 via the via conductor VC.

A major portion of the connection pad C except a connection surface Cx is buried to the outer surface 30x side of the insulating layer 30, and the connection surface Cx is exposed from the insulating layer 30. Then, the connection pad C is embedded in the insulating layer 30 in a state that the connection surface Cx sinks to the inner layer side from the outer surface 30x of the insulating layer 30 by a depth d.

That is, a concave portion 30a having a depth d is provided to the outer surface 30x side of the insulating layer 30. And the connection pad C is buried in the insulating layer 30 on the bottom side of the concave portion 30a, and the connection surface Cx of the connection pad C is positioned on the bottom surface of the concave portion 30a.

In this case, the "outer surface side" denotes the outward direction (the lower side in FIG. 2A) in the wiring substrate 1, and the "inner surface side" denotes the inward direction (the upper side in FIG. 2A) in the wiring substrate 1.

Although not particularly depicted, the wiring layer 40 is laminated to the inner layer side (the opposite side to the connection pad C) by any number of laminated layers.

Like a second embodiment described later, the concave portion 30a does not provided in the insulating layer 30, and the connection surface Cx of the connection pad C and the outer surface 30x of the insulating layer 30 may be arranged in the identical height position to constitute the identical surface. Otherwise, like a third embodiment described later, the connection pad C may be formed as the bump electrode which protrudes outward from the outer surface 30x of the insulating layer 30.

That is, at least a part of the connection pad C may be buried to the outer surface 30x side of the insulating layer 30, thereby the connection pad C may function as the external connection electrode.

Next, a structure of the connection pad C will be explained hereunder. The connection pad C is constructed by a first metal layer 20 arranged to the outer layer side, an intermediate metal layer 22 arranged to a surface of the inner layer side of the first metal layer 20 (an upper surface in FIG. 2A), a second metal layer 24 arranged to a surface of the inner layer side of the intermediate metal layer 22 (an upper surface in FIG. 2A), and a surface treatment layer 16 arranged to a surface of the outer layer side of the first metal layer 20 (a lower surface in FIG. 2A).

As the surface treatment layer 16, a contact layer may be formed or an antioxidizing agent may be formed. In the case that the contact layer is formed, this contact layer is formed of a nickel layer/a gold layer (the gold layer is formed to the outer surface side), a nickel layer/a palladium layer/a gold layer (the gold layer is formed to the outer surface side), a palladium layer/a gold layer (the gold layer is formed to the outer surface side), a gold layer, or a tin (Sn) layer, or the like.

Also, in the case that the antioxidizing agent is formed, OSP (Organic Solder Passivation) formed of an imidazole compound is employed. The antioxidizing agent (OSP) prevents an oxidation of the connection surface Cx of the connection pad C, and disappears when the solder bump, or the like is mounted on the connection pad C by applying the heating process. In this case, such a mode may be employed that the surface treatment layer 16 is omitted from the connection pad C.

In this manner, the connection pad C includes such a structure that the intermediate metal layer 22 is put between the first metal layer 20 and the second metal layer 24.

Also, the intermediate metal layer 22 is set larger than respective areas (diameters) of the first metal layer 20 and the second metal layer 24, and is arranged to protrude from them to the outside. The position of the outer edge part of the intermediate metal layer 22 is arranged to the outside than the positions of the respective outer edge parts of the first metal layer 20 and the second metal layer 24. Accordingly, the peripheral part of the intermediate metal layer 22 constitutes a protrusion portion P which protrudes from the respective outer edge parts of the first metal layer 20 and the second metal layer 24 to the outside thereof. In this manner, in the connection pad C of the wiring substrate 1, the intermediate metal layer 22 has the protrusion portion P, thus a level difference (unevenness) is provided to the side surface of the connection pad C.

The connection pad C is formed from a circle shape, or a square shape, or the like, and the protrusion portion P of the intermediate metal layer 22 is provided along its outer edge. The connection pad C may be arranged like an island, and may be arranged at one end of the wiring layer to which this connection pad C is connected. In the case that the connection pad C is arranged like an island, the protrusion portion P of the intermediate metal layer 22 is arranged to be connected like a ring.

Also, a hardness of the intermediate metal layer 22 is set higher than a hardness of the first and second metal layers 20, 24. The following hardness is A Mohs hardness.

As a preferable example, the intermediate metal layer 22 is formed of nickel (Ni) (hardness: 4.0), and the first metal layer 20 and the second metal layer 24 are formed of copper (Cu) (hardness: 3.0). As the first metal layer 20 and the second metal layer 24, metal wiring material such as aluminum (Al), gold (Au)(hardness of both metals: 2.50), or the like may be employed in addition to the copper.

The intermediate metal layer 22 may be formed of any metal if a hardness of this metal is higher than the first and second metal layers 20, 24. In addition to the nickel, palladium (Pd) (hardness: 4.75), chromium (Cr) (hardness: 8.50), iron (Fe) (hardness: 4.00), molybdenum (Mo) (hardness: 5.50), manganese (Mn) (hardness: 6.00), cobalt (Co) (hardness: 5.00), titanium (Ti) (hardness: 6.00), or the like may be employed.

Here, the connection pad C having a four-layered structure whose side surface is shaped to level difference shape is illustrated in FIG. 2A, but the number of laminated layers can be set arbitrarily. In such case, the intermediate metal layer 22 and the second metal layer 24 whose area is smaller than the intermediate metal layer 22 are laminated alternately on the connection pad C in FIG. 2A.

Figure 2B:
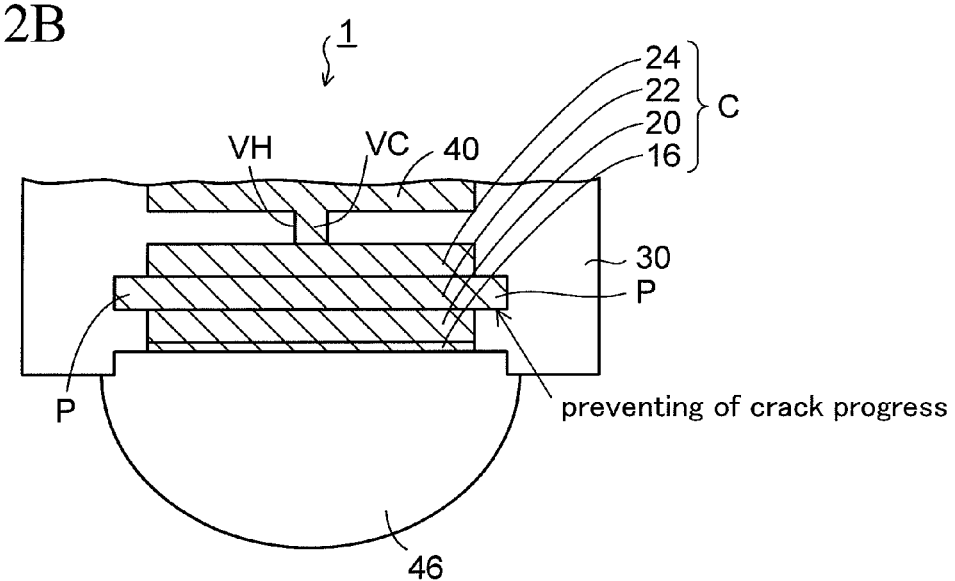

In FIG. 2B, a state in which a solder bump 46 is mounted on the connection pad C of the wiring substrate 1 in FIG. 2A is illustrated. Also, as explained in the related art, a semiconductor chip (not shown) is flip-chip connected to a chip connection pad (not shown) formed on the opposite side to the connection pad C, and then the wiring substrate 1 is mounted onto the connection electrodes of the mounting substrate (motherboard) via the solder bump 46, and thus an electronic component module (not shown) is constructed.

Also, as explained in the related art, in such electronic component module, the drop test is performed as the reliability test. In the wiring substrate 1 of the present embodiment, a hardness of the intermediate metal layer 22 of the connection pad C is set higher than those of the first metal layer 20 and the second metal layer 24, and the intermediate metal layer 22 has the protrusion portion P which protrudes from the outer edge parts of the first metal layer 20 and the second metal layer 24 to the outer side thereof (in the lateral direction).

Accordingly, as depicted in FIG. 2B, when the drop test is performed, even when the crack is generated in the first metal layer 20 (copper) of the connection pad C, the progress of the crack toward the inner layer side can be stopped by the intermediate metal layer 22 whose hardness is high.

Also, even when the crack progresses from the boundary between the first metal layer 20 and the insulating layer 30 of the connection pad C to the inner layer side, the progress of the crack toward the inner layer side can be stopped by the protrusion portion P of the intermediate metal layer 22 whose hardness is high. This is because the intermediate metal layer 22 has a high hardness and thus the crack is hard to occur to itself.

In this manner, in the wiring substrate 1 of the present embodiment, such a situation can be prevented that the crack progresses from the periphery of the connection pad C toward the inner layer side. Therefore, a production yield of the electronic component module can be improved, and high reliability can be obtained in using the electronic device (the cellular phone, or the like) into which the electronic component module is installed.

Like the foregoing related art, in the first embodiment, the coreless type wiring substrate 1 having no core substrate is illustrated, and the insulating layer 30 functions as the substrate. As explained in a manufacturing method described later, the wiring substrate 1 is manufactured based on forming the build-up wiring including the connection pads on the supporting substrate, and then removing the supporting substrate. Therefore, the connection pads C of the wiring substrate 1 are formed in a state that these pads are buried in the insulating layer 30.

In particular, in the coreless type wiring substrate 1, there is such a tendency that the crack is ready to be generated from the periphery of the connection pad C. Therefore, such a situation is preferable that the structure of the connection pad C in the present embodiment should be applied to the coreless type wiring substrate. As the need arises, the structure of the connection pad C in the present embodiment can be applied as the connection pads of the rigid type wiring substrate having the insulating substrate (the core substrate) made of a glass epoxy resin, or the like.

In this case, the structure of the connection pad C of the wiring substrate 1 in the present embodiment may be applied not only as the connection pad connected to the mounting substrate but also as the chip connection pad on the opposite side to which the semiconductor chip is connected.

Figure 3:
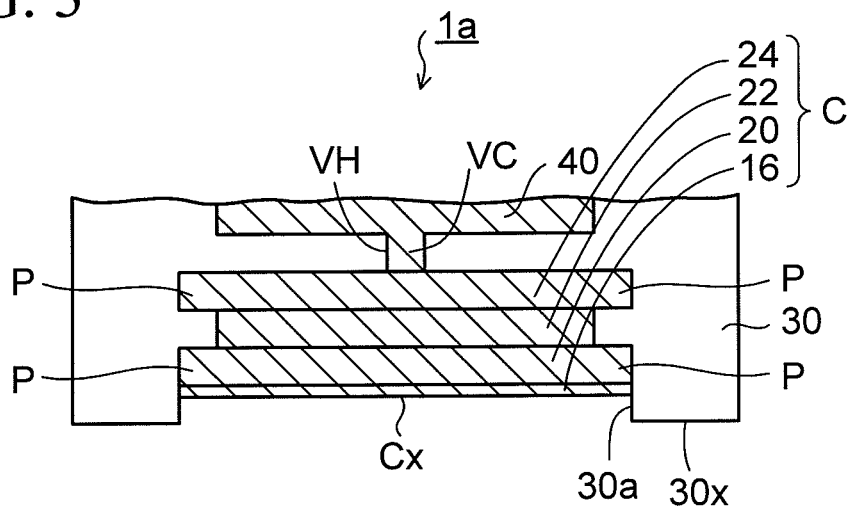
FIG. 3 is a sectional view depicting a wiring substrate according to a first variation of the first embodiment.

In FIG. 3, a wiring substrate 1a according to a first variation of the first embodiment is depicted. As depicted in FIG. 3, in the wiring substrate 1a according to the first variation of the first embodiment, on the contrary to the connection pad C of the wiring substrate 1 in FIG. 2A, the intermediate metal layer 22 of the connection pad C has a smaller area (diameter) than those of the first metal layer 20 and the second metal layer 24 and is arranged in the center part between them, and also the positions of the outer edge parts of the first metal layer 20 and the second metal layer 24 are arranged to the outside than the position of the outer edge parts of the intermediate metal layer 22.

Accordingly, respective peripheral parts of the first metal layer 20 and the second metal layer 24 constitute the protrusion portion P which protrudes from the outer edge parts of the intermediate metal layer 22 to the outside (in the lateral direction). In this way, in the connection pad C of the wiring substrate 1a of the first variation, the first and second metal layers 20, 24 have the protrusion portion P, thus a level difference (unevenness) is provided to the side surfaces thereof.

Also, like the wiring substrate 1 in FIG. 2A, a hardness of the intermediate metal layer 22 (nickel, or the like) of the connection pad C is set higher than a hardness of the first metal layer 20 and the second metal layer 24 (copper, or the like). In FIG. 3, remaining elements are similar to those in FIG. 2A, and therefore their explanation will be omitted herein.

The connection pad C of the wiring substrate 1a of the first variation has the intermediate metal layer 22 whose hardness is high in the inside part. Therefore, even when the crack is generated in the first metal layer 20 of the connection pad C, the progress of the crack can stop by the intermediate metal layer 22.

Also, in the wiring substrate 1a of the first variation, the first and second metal layers 20, 24 of the one where the hardness is low have the protrusion portion P. Therefore, the effect of preventing the progress of the crack which is generated from the boundary between the connection pad C and the insulating layer 30 is weaker than the wiring substrate 1 in FIG. 2A, nevertheless the structure in which the crack is hard to progress to the inner layer side can be obtained because a level difference is provided to the side surface of the connection pad C.

Also in the connection pad C of the wiring substrate 1a of the first variation, the number of laminated layers can be set arbitrarily. In such case, the intermediate metal layer 22 and the second metal layer 24 whose area is larger than an area of the intermediate metal layer 22 are laminated alternately on the connection pad C in FIG. 3.

Figure 4:
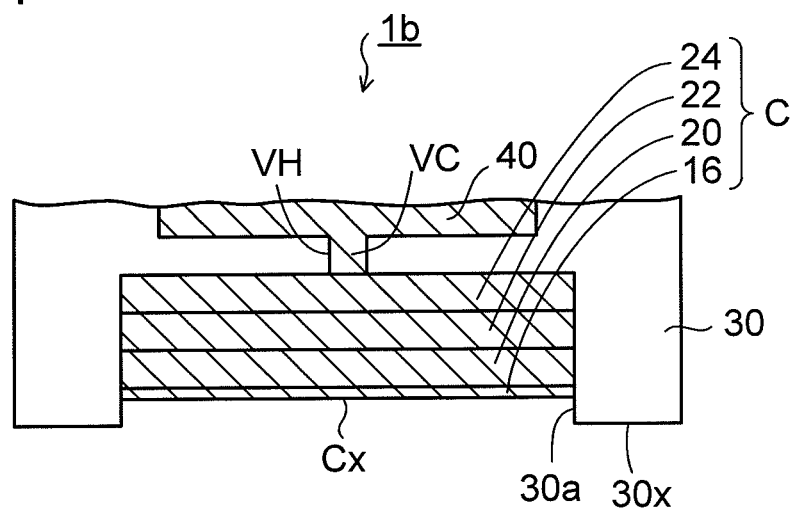
FIG. 4 is a sectional view depicting a wiring substrate according to a second variation of the first embodiment.

In FIG. 4, a wiring substrate 1b according to a second variation of the first embodiment is depicted. As depicted in FIG. 4, in the connection pad C of the wiring substrate 1b of the second variation, the intermediate metal layer 22 and the first metal layer 20 and the second metal layer 24 are arranged to have the identical area (diameter), thus their side surfaces constitute the straight shape, and a level difference is not provided to the side surface.

Also in the connection pad C of the wiring substrate 1b of the second variation, the number of laminated layers can be set arbitrarily. In such case, the intermediate metal layer 22 and the second metal layer 24 having the identical area with the intermediate metal layer 22 are laminated alternately on the connection pad C in FIG. 4.

Similarly, in the wiring substrate 1b of the second variation, when the crack is generated in the first metal layer 20 of the connection pad C, the progress of the crack toward the inner layer side is prevented by the intermediate metal layer 22 whose hardness is high.

In the wiring substrate 1b of the second variation, the side surface of the connection pad C has the straight shape. Therefore, the effect of preventing the progress of the crack which is generated from the boundary between the connection pad C and the insulating layer 30 is small.

Nevertheless, in the wiring substrate 1b of the second variation, it is not needed to process the side surface of the connection pad C like a level difference shape. Therefore, the manufacturing process can be made simple, and it can be manufactured at a low cost.

The location where the crack is easy to be generated is different depending on the structure of the wiring substrate and the mounting method. Therefore, in view of the location where the crack is easy to be generated and the production cost, a shape of the side surface of the connection pad C may be selected.

Next, methods of manufacturing the wiring substrate according to the first embodiment will be explained hereunder.

(First Method of Manufacturing the Wiring Substrate According to the First Embodiment)

Figure 5A:
FIGS. 5A to 5E are sectional views (#1) depicting a first method of manufacturing the wiring substrate according to the first embodiment.

In the first method of manufacturing the wiring substrate of the first embodiment, as depicted in FIG. 5A, first, a copper plate 10 is prepared as the supporting substrate. The copper plate 10 is illustrated as the supporting substrate, any member can be employed if such member can function as a plating power feeding path for the electroplating and also can be removed easily by the wet etching, or the like. The conductive materials such as various metal plates, metallic foils, etc. can be employed as the supporting substrate. This is similarly true of other embodiments described in the following.

Figure 5B:
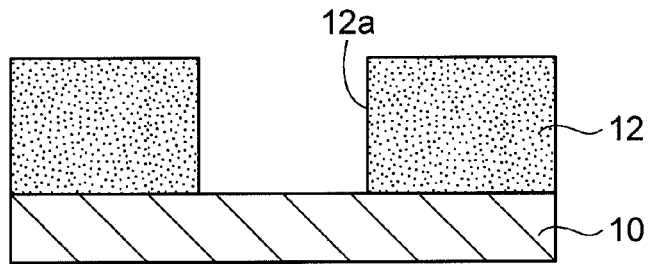

Then, as depicted in FIG. 5B, a resist 12 in which an opening portion 12a is provided in the portion where the connection pad C is to be arranged is formed on the copper plate 10. The opening portion 12a is formed by exposing/developing the resist 12 by means of the photolithography. As the resist 12, a dry film resist may be pasted or a liquid resist may be coated.

Figure 5C:
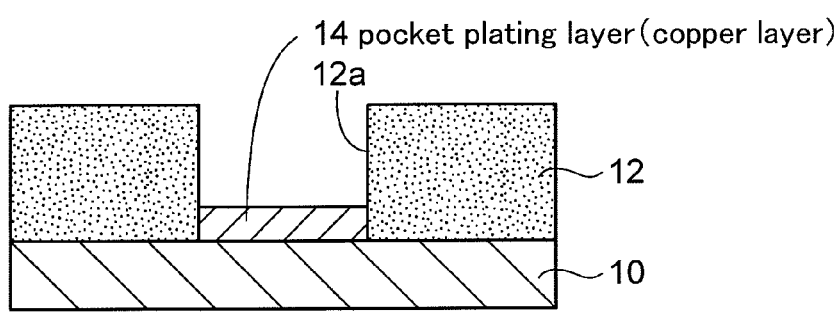

Then, as depicted in FIG. 5C, a pocket plating layer 14 is formed on a bottom part of the opening portion 12a in the resist 12 by the electroplating utilizing the copper plate 10 as a plating power feeding path. As the pocket plating layer 14, a copper layer of 5 to 15 μm thickness is employed. As explained in the wiring substrate 1 in FIG. 2A mentioned above, the pocket plating layer 14 is formed so as to lower the position of the connection pad C from the outer surface 30x of the insulating layer 30 toward the inner layer side by a depth d.

Figure 5D:
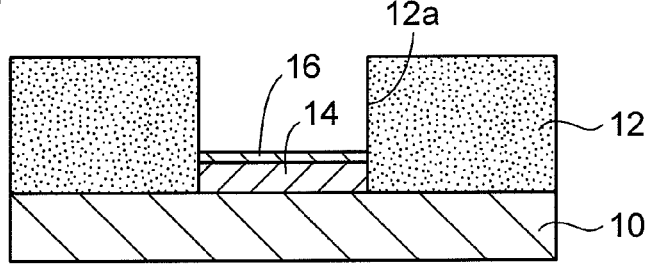

Then, as depicted in FIG. 5D, the surface treatment layer 16 (the contact layer) is formed on the pocket plating layer 14 in the opening portion 12a of the resist 12 by the similar electroplating. As a preferable example of the surface treatment layer 16, a gold (Au) layer (thickness: 0.005 to 0.5 μm)/a nickel (Ni) layer (thickness: 0.005 to 10 μm) are formed in order from the bottom. Here, a palladium (Pd) layer (thickness: 0.005 to 0.5 μm) may be further formed between the gold layer and the nickel layer to constitute surface treatment layer 16.

Figure 5E:
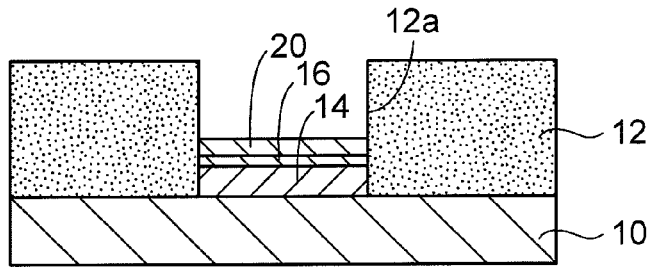

Then, as depicted in FIG. 5E, the first copper layer 20 (the first metal layer) of 0.5 to 15 μm thickness is formed on the surface treatment layer 16 in the opening portion 12a of the resist 12 by the similar electroplating.

Figure 6A:
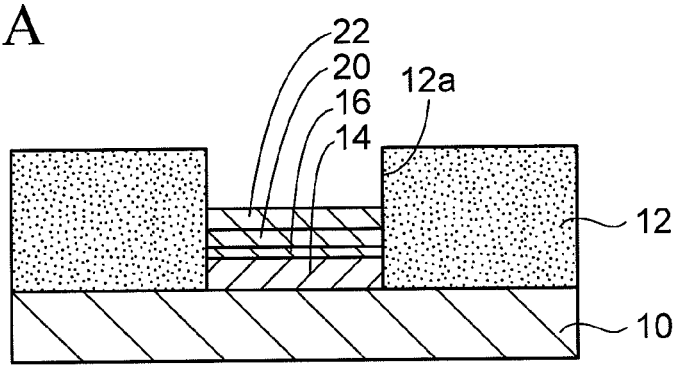
FIGS. 6A to 6D are sectional views (#2) depicting the first method of manufacturing the wiring substrate according to the first embodiment.

Then, as depicted in FIG. 6A, the nickel layer 22 (the intermediate metal layer) of 5 to 15 μm thickness is formed on the first copper layer 20 in the opening portion 12a of the resist 12 by the similar electroplating.

Figure 6B:
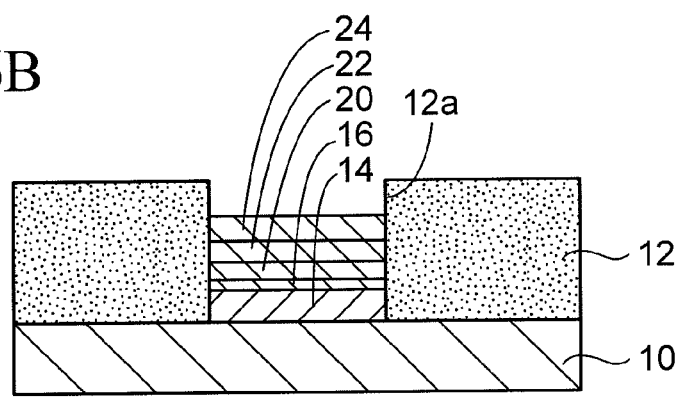

Then, as depicted in FIG. 6B, the second copper layer 24 (the second metal layer) of 5 to 15 μm thickness is formed on the nickel layer 22 in the opening portion 12a of the resist 12 by the similar electroplating.

Figure 6C:
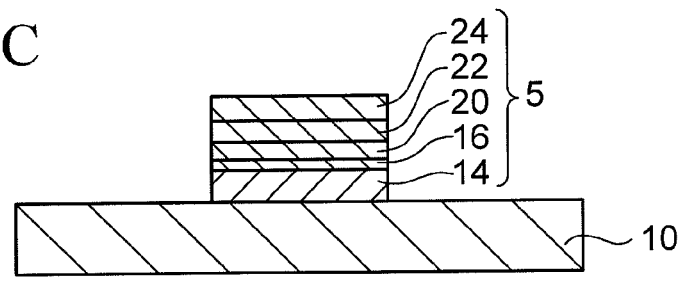

Then, as depicted in FIG. 6C, the resist 12 is removed. Accordingly, a metal laminated portion 5 which is constructed by the pocket plating layer 14, the surface treatment layer 16, the first copper layer 20 (the first metal layer), the nickel layer 22 (the intermediate metal layer), and the second copper layer 24 (the second metal layer) in order from the bottom is obtained on the copper plate 10. As described later, in the present embodiment, the connection pad is constructed by the surface treatment layer 16, the first copper layer 20, the nickel layer 22, and the second copper layer 24 out of the metal laminated portion 5.

Figure 6D:
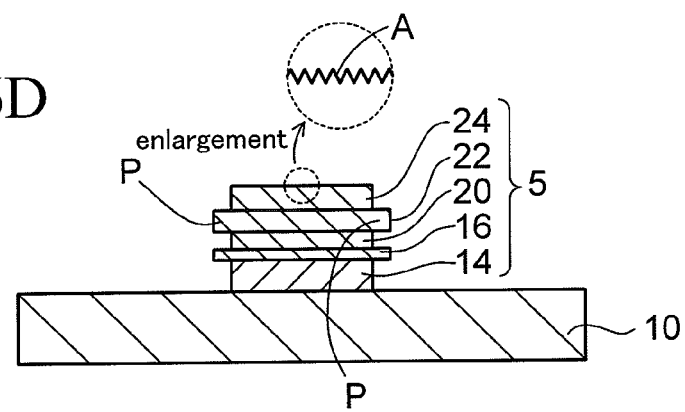

Then, as depicted in FIG. 6D, the first copper layer 20 and the second copper layer 24 of the structure in FIG. 6C are etched by 1 to 2 μm by an acetic acid-based etchant. Thus, these surfaces are processed into a roughened surface A (fragmental enlarged view).

Also, the metal laminated portion 5 is processed by SPM (Sulfuric acid hydrogen Peroxide Mixture solution ($H_2SO_4$/$H_2O_2$)). Thus, the first copper layer 20 and the second copper layer 24 are wet-etched until the halfway position of the thickness selectively to the nickel layer 22.

Since an etching rate of the nickel layer 22 by the SPM is low, the peripheral sides of the first and second copper layers 20, 24 arranged to upper and lower sides of the nickel layer 22 are side-etched inwardly and are retreat. Thus, the peripheral part of the nickel layer 22 constitutes the protrusion portion P which protrudes from the outer edge parts of the first and second copper layers 20, 24 to the outside.

An amount of side etching of the first and second copper layers 20, 24, i.e., a protrusion length of the protrusion portion P of the nickel layer 22, is set to 2 to 15 μm.

At this time, the pocket plating layer 14 is also etched inwardly simultaneously. Also, since an etching rate of the surface treatment layer 16 (the gold layer/the nickel layer) by the SPM is low, such a situation is obtained that the surface treatment layer 16 is formed to protrude from the first and second copper layers 20, 24 and the pocket plating layer 14 to the outside.

In this case, in the wiring substrate 1 in FIG. 2A, when another metal combination is employed as the first metal layer 20, the intermediate metal layer 22, and the second metal layer 24, a metal combination to which the wet etching can be applied selectively is employed.

Figure 7A:
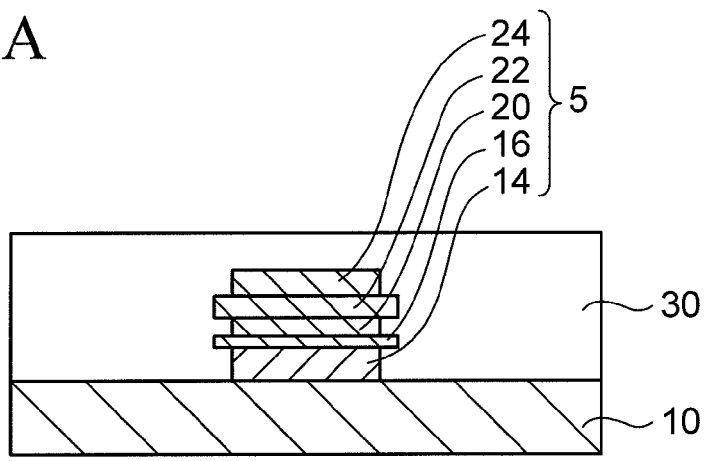
FIGS. 7A to 7C are sectional views (#3) depicting the first method of manufacturing the wiring substrate according to the first embodiment.

Then, as depicted in FIG. 7A, the first insulating layer 30 is formed by thermo-compression bonding a resin sheet such as an epoxy resin, or the like on the copper plate 10 and the metal laminated portion 5. Accordingly, the metal laminated portion 5 is embedded in the first insulating layer 30. Otherwise, the first insulating layer 30 may be formed by coating a liquid resin instead of the resin sheet, and then curing the liquid resin by applying the heating treatment.

The surfaces of the first and second copper layers 20, 24 of the metal laminated portion 5 are processed into the roughened surface A (FIG. 6D). Therefore, the first insulating layer 30 is formed on the metal laminated portion 5 with good adhesion by the anchor effect.

Figure 7B:
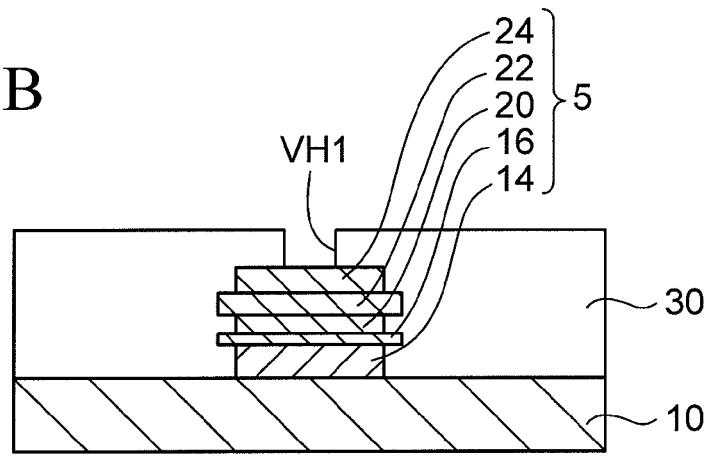

Then, as depicted in FIG. 7B, a first via hole VH1 which reaches the metal laminated portion 5 is formed by processing the first insulating layer 30 by means of the laser.

Figure 7C:
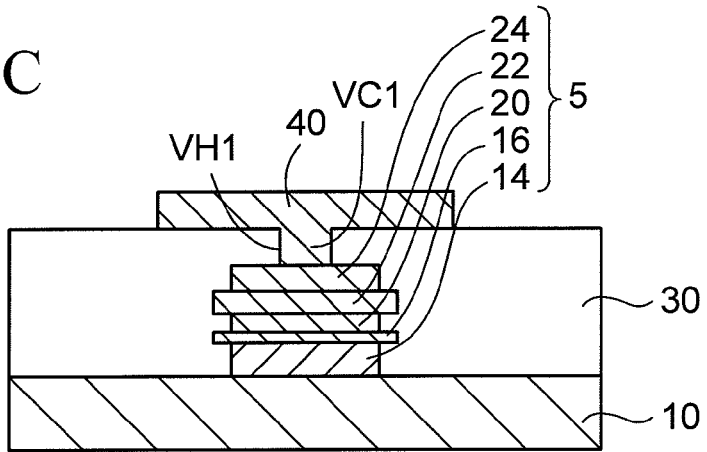

Then, as depicted in FIG. 7C, the first wiring layer 40 connected to the metal laminated portion 5 (the second metal layer 24) via a first via conductor VC1 filled in the first via hole VH1, is formed on the first insulating layer 30. The first wiring layer 40 is formed by the semi-additive process, for example. In more detailed explanation, first, a seed layer (not shown) made of copper, or the like is formed on the first insulating layer 30 and in the first via conductor VC1 by the electroless plating.

Then, a plating resist (not shown) in which an opening portion is provided in the part where the first wiring layer 40 is arranged is formed on the seed layer. Then, a metal plating layer made of copper, or the like is formed from the inner part of the first via hole VH1 toward an opening portion of the plating resist by the electroplating utilizing the seed layer as a plating power feeding path. Then, the plating resist is removed, and then the first wiring layer 40 is obtained by etching the seed layer while using the metal plating layer as a mask.

Figure 8A:
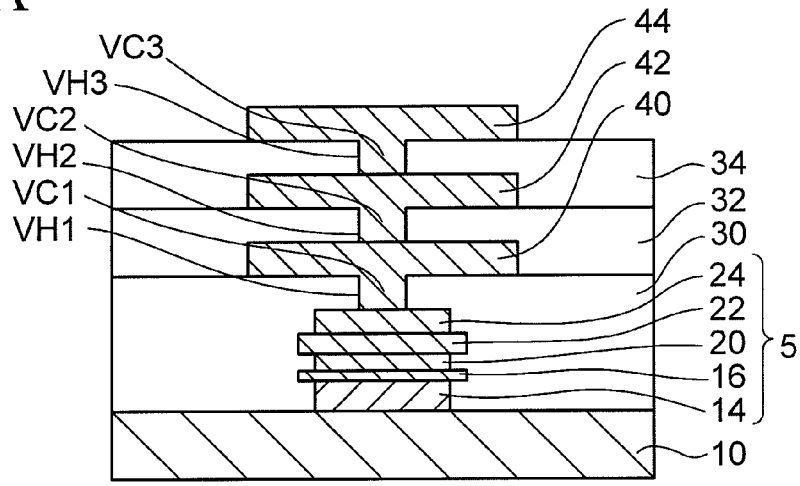
FIGS. 8A to 8C are sectional views (#4) depicting the first method of manufacturing the wiring substrate according to the first embodiment.

Then, as depicted in FIG. 8A, the similar steps are repeated further. Thus, a second insulating layer 32 which has a second via hole VH2 on the first wiring layer 40 is formed, and then a second wiring layer 42 connected to the first wiring layer 40 via a second via conductor VC2 filled in the second via hole VH2 is formed on the second insulating layer 32.

Also, as depicted in FIG. 8A, the similar steps are repeated furthermore. Thus, a third insulating layer 34 which has a third via hole VH3 on the second wiring layer 42 is formed, and then a third wiring layer 44 connected to the second wiring layer 42 via a third via conductor VC3 filled in the third via hole VH3 is formed on the third insulating layer 34.

Figure 8B:
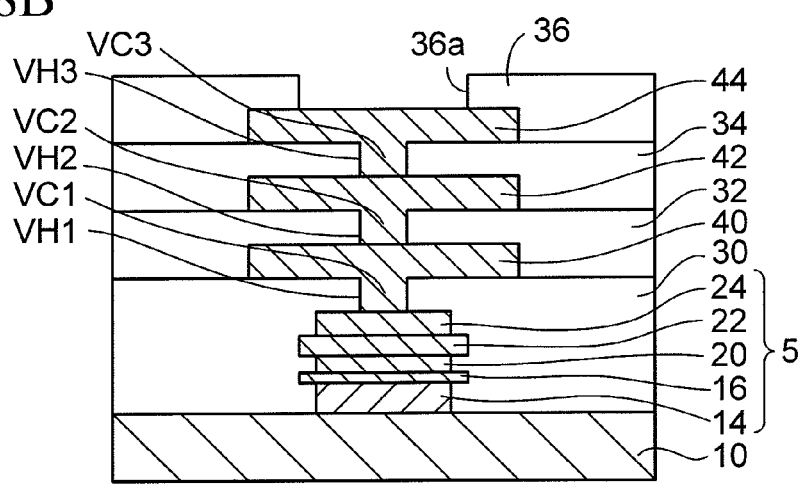

Then, as depicted in FIG. 8B, a solder resist 36 in which an opening portion 36a is provided on the connection part (the chip connection pad) of the third wiring layer 44 is formed on the third insulating layer 34.

Accordingly, a four-layered build-up wiring including the metal laminated portion 5 for obtaining the connection pad is formed on the copper plate 10.

Figure 8C:
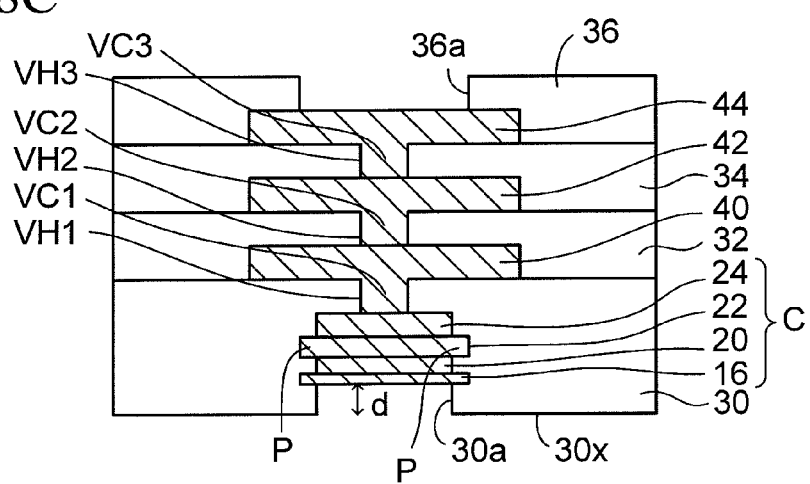

Then, as depicted in FIG. 8C, the copper plate 10 is removed by the wet etching using the SPM, or an alkaline etchant, or the like, and successively the pocket plating layer 14 (the copper layer) positioned at the lowest part of the metal laminated portion 5 is removed by the wet etching.

Accordingly, the lower surface of the first insulating layer 30 and the surface treatment layer 16 (the lowermost layer is the gold layer) of the metal laminated portion 5 are exposed. The pocket plating layer 14 (the copper layer) can be etched selectively to the gold layer of the surface treatment layer 16, and thus this surface treatment layer 16 can be exposed not to cause its corrosion.

In this manner, the copper plate 10 and the pocket plating layer 14 positioned at the lowest part of the metal laminated portion 5 are etched successively and thus removed. As a result, the concave portion 30a having a depth d is formed to the outer surface 30x side of the first insulating layer 30.

Then, the connection pad C which is constructed by the surface treatment layer 16, the first copper layer 20 (the first metal layer), the nickel layer 22 (the intermediate metal layer), and the second copper layer 24 (the second metal layer) in order from the bottom, is embedded to the bottom surface side of the concave portion 30a of the first insulating layer 30 and is arranged there.

According to the above, the connection surface Cx of the connection pad C is arranged to sink into the inner layer side from the outer surface 30x of the first insulating layer 30 by a thickness (a depth d) of the pocket plating layer 14.

With the above, as depicted in FIG. 8C, the wiring substrate which is substantially identical with the foregoing wiring substrate 1 in FIG. 2A is manufactured.

Here, in FIG. 8C, the peripheral part of the thin-film surface treatment layer 16 protrudes from the first and second copper layers 20, 24 (the first and second metal layers) to the outside. In this case, by selectively wet-etching the surface treatment layer 16 in the step in FIG. 6D, the outer edge part of the surface treatment layer 16 may be arranged in the identical positions with the first and second copper layers 20, 24 (the first and second metal layers).

Also, since the pocket plating layer 14 is formed of a copper layer in the first manufacturing method, the side surface of the concave portion 30a of the first insulating layer 30 is arranged in the identical position with the first and second copper layers 20, 24.

In the case that the wiring substrate 1a according to the first variation in FIG. 3 is manufactured, instead of etching the first and second copper layers 20, 24 in the above step in FIG. 6D, by wet-etching the nickel layer 22 selectively to the first and second copper layers 20, 24, the peripheral parts of the first copper layer 20 and the second copper layer 24 may be shaped into the protrusion portion P. As an etchant of the nickel layer 20, NPM (Nitric acid hydrogen Peroxide Mixture solution ($HNO_3/H_2O_2$)) is employed.

Also, in the case that the wiring substrate 1b according to the second variation in FIG. 4 is manufactured, by omitting the step of the side etching of the metal laminated portion 5 in the above step in FIG. 6D, the connection pad C whose side surface has straight shape may be formed.

(Second Method of Manufacturing the Wiring Substrate According to the First Embodiment)

Figure 9A:
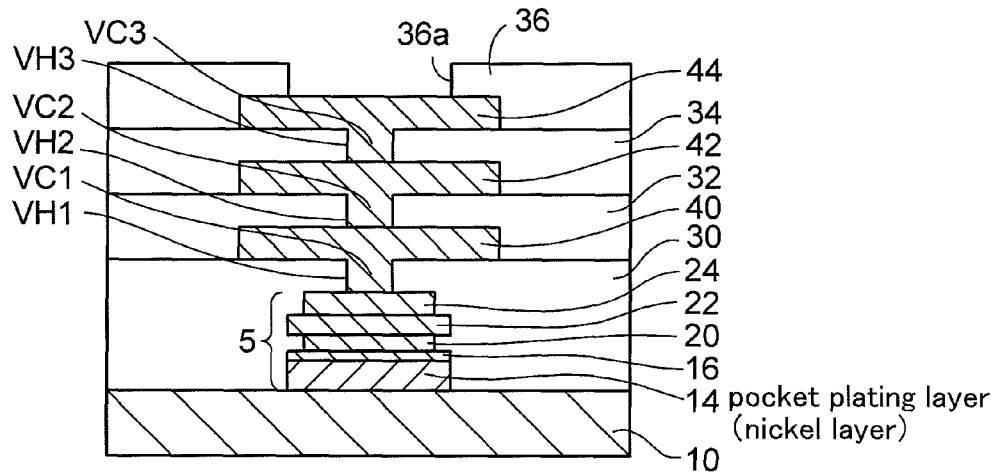
FIGS. 9A to 9C are sectional views depicting a second method of manufacturing the wiring substrate according to the first embodiment.
Figure 9B:
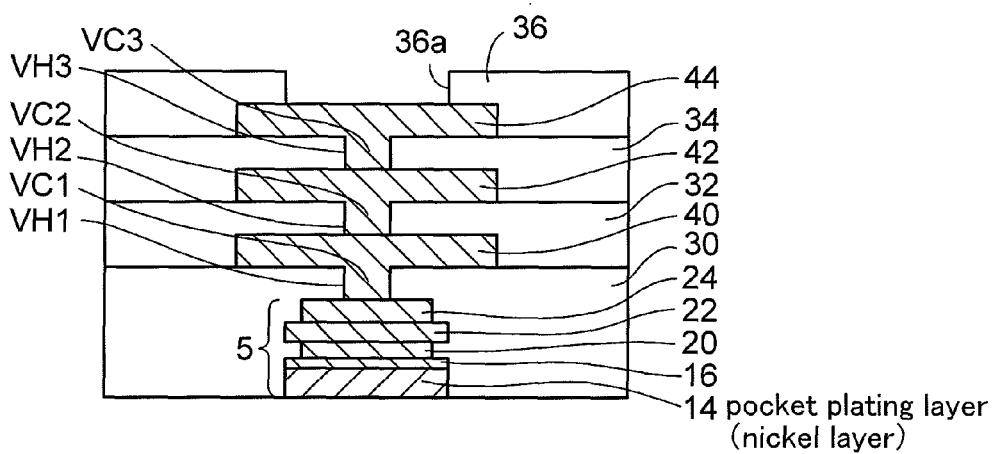
Figure 9C:
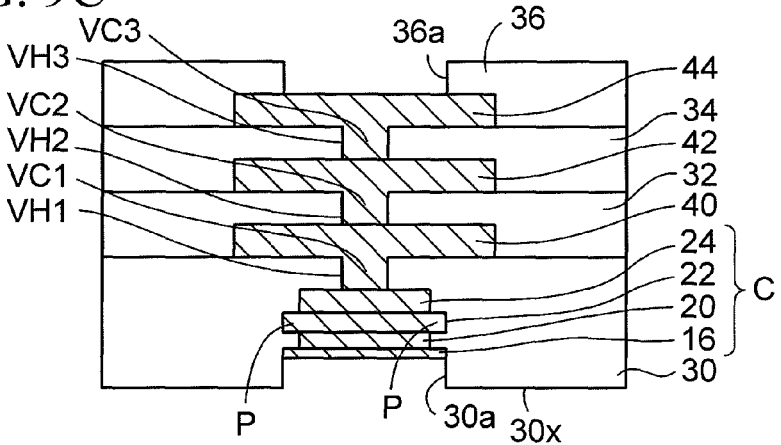

FIGS. 9A to 9C are sectional views depicting a second method of manufacturing a wiring substrate according to the first embodiment.

A difference of the second method of manufacturing the wiring substrate according to the first embodiment from the first manufacturing method is that a nickel layer is employed as the pocket plating layer 14.

That is, in the above step of forming the pocket plating layer 14 in FIG. 5C, a nickel layer is formed in place of the copper layer. Then, a structure in FIG. 9A is obtained by executing the same steps with FIG. 5D to FIG. 8B.

In the second manufacturing method, the pocket plating layer 14 is formed of a nickel layer. Therefore, when the first and second copper layers 20, 24 are side-etched, the pocket plating layer 14 is arranged in the identical position with the nickel layer 22 for constituting the connection pad.

Then, as depicted in FIG. 9B, the copper plate 10 is removed by the wet etching using the SPM. At this time, the copper plate 10 is etched selectively to the pocket plating layer 14 (the nickel layer), and the pocket plating layer 14 (the nickel layer) is left.

Then, the pocket plating layer 14 (the nickel layer) is wet-etched selectively to the surface treatment layer 16 (the lowermost layer is the gold layer) by using the SPM, and is removed. Accordingly, the surface treatment layer 16 positioned in the lowest part of the connection pad C is exposed not to cause the corrosion.

With the above, as depicted in FIG. 9C, the wiring substrate which is substantially identical with the above wiring substrate 1 in FIG. 2A is manufactured.

In the second manufacturing method, the pocket plating layer 14 is formed of the nickel layer. Therefore, the side surface of the concave portion 30a of the first insulating layer 30 is arranged in the identical position with the outer edge part of the nickel layer 22 (the intermediate metal layer).

(Third Method of Manufacturing the Wiring Substrate According to the First Embodiment)

Figure 10A:
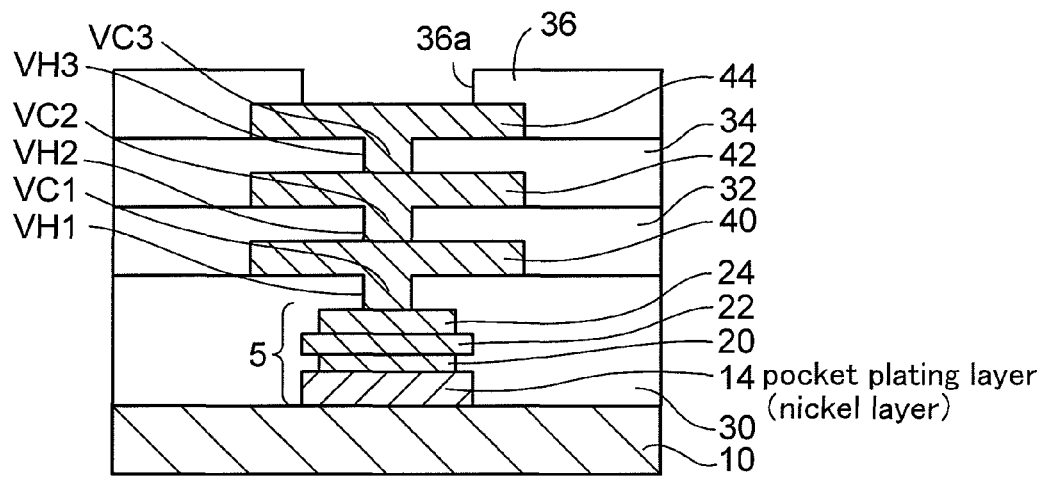
FIGS. 10A to 10C are sectional views depicting a third method of manufacturing the wiring substrate according to the first embodiment.
Figure 10B:
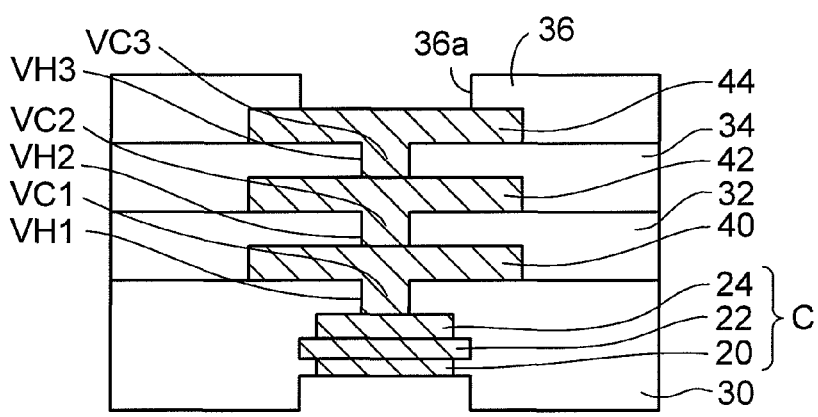
Figure 10C:
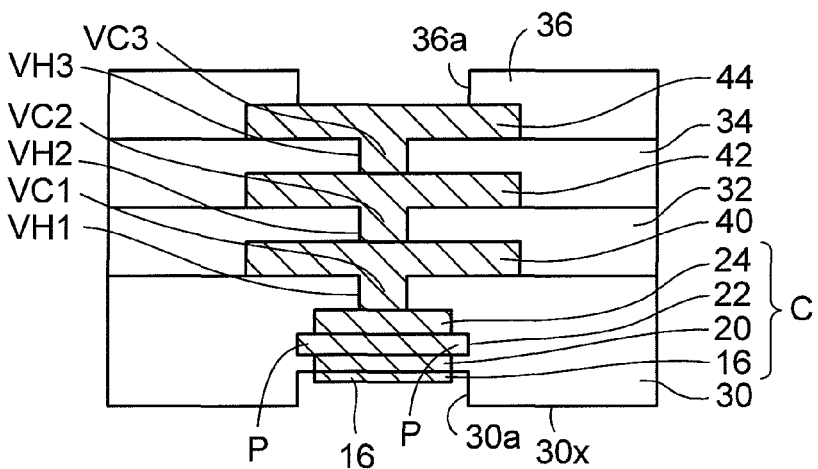

FIGS. 10A to 10C are sectional views depicting a third method of manufacturing the wiring substrate according to the first embodiment.

As depicted in FIG. 10A, a difference of the third method of manufacturing the wiring substrate according to the first embodiment from the second manufacturing method is that the surface treatment layer 16 is omitted in FIG. 9A in the second manufacturing method mentioned above.

That is, instead of the copper layer, the nickel layer is formed in the above step of forming the pocket plating layer 14 in FIG. 5C in the first embodiment, and thus the surface treatment layer 16 is omitted in the step in FIG. 5D. Then, a structure in FIG. 10A is obtained by executing the same steps with those in FIG. 5E to FIG. 8B in the first embodiment.

Then, as depicted in FIG. 10B, the copper plate 10 is wet-etched selectively to the pocket plating layer 14 (the nickel layer) by the SPM, or the alkaline etchant, or the like and is removed, and then the pocket plating layer 14 (the nickel layer) is wet-etched selectively to the first copper layer 20 of the connection pad C and is removed. Accordingly, the first copper layer 20 (the first metal layer) of the connection pad C can be exposed not to cause the corrosion.

As depicted in FIG. 10B, the resultant substrate may be employed as the wiring substrate in a state that he first copper layer 20 (the first metal layer) of the connection pad C is exposed.

Otherwise, as depicted in FIG. 10C, the surface treatment layer 16 may be formed on the exposed surface of the first copper layer 20 of the connection pad C. As described above, the contact layer such as a nickel layer/a gold layer (the gold layer is formed on the outer surface side), a nickel layer/a palladium layer/a gold layer (the gold layer is formed on the outer surface side), a palladium layer/a gold layer (the gold layer is formed on the outer surface side), a gold layer, or a tin (Sn) layer, or the like is formed as the surface treatment layer 16 by the electroless plating, or the like.

Alternatively, the antioxidizing agent (OSP) may be formed as the surface treatment layer 16.

In FIGS. 10B and 10C, other elements are similar to those in FIG. 2A, and their explanation will be omitted therein.

Second Embodiment

A feature of a wiring substrate of the second embodiment resides in that, in the wiring substrate 1 in FIG. 2A in the first embodiment, the connection surface Cx of the connection pad C is arranged at the identical height with the outer surface 30x of the first insulating layer 30 such that their surfaces constitute the identical surface.

In the second embodiment, detailed explanations about the same elements and the same steps as those in the first embodiment will be omitted herein.

(First Method of Manufacturing a Wiring Substrate According to the Second Embodiment)

Figure 11A:
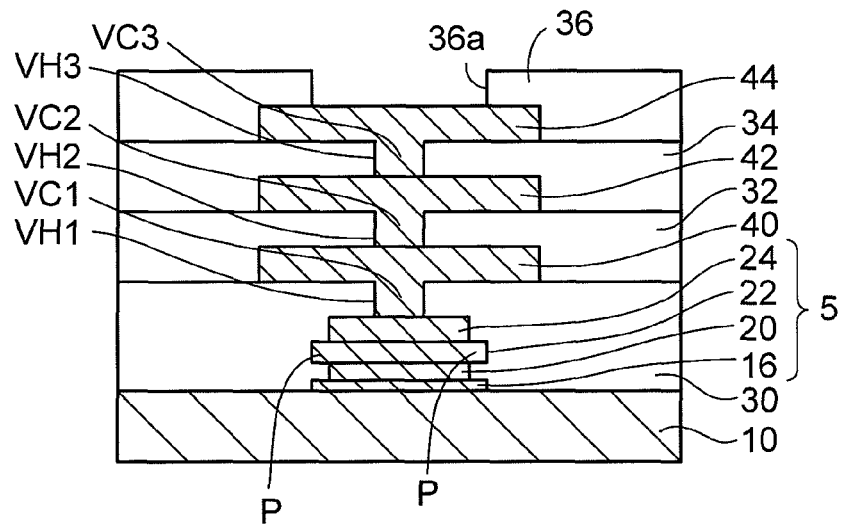
FIGS. 11A and 11B are sectional views depicting a first method of manufacturing a wiring substrate according to a second embodiment.
Figure 11B:
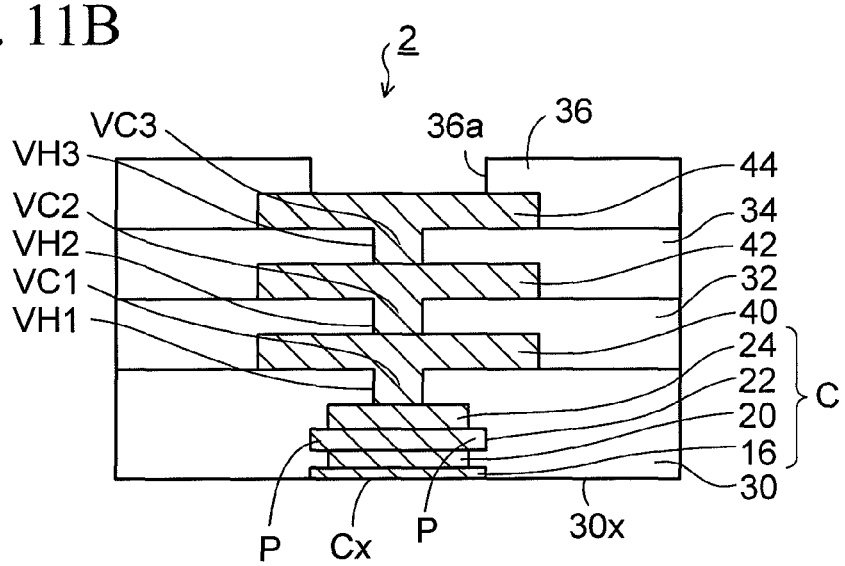

FIGS. 11A and 11B are sectional views depicting a first method of manufacturing the wiring substrate according to the second embodiment.

In the first method of manufacturing the wiring substrate according to the second embodiment, the pocket plating layer 14 is omitted from above FIG. 5C in the first embodiment. A structure in FIG. 11A is obtained by executing the same steps as those in FIG. 5D to FIG. 8B. Accordingly, as depicted in FIG. 11A, on the copper plate, the outer surface of the surface treatment layer 16 of the connection pad C is arranged in the identical height position with that of the outer surface of the first insulating layer 30 such that their surfaces constitute the identical surface.

Then, as depicted in FIG. 11B, the copper plate 10 is wet-etched selectively to the surface treatment layer 16 (the lowermost layer is the gold layer) and is removed. Accordingly, the surface treatment layer 16 of the connection pad C can be exposed not to cause the corrosion.

Then, the connection surface Cx of the connection pad C is arranged in the identical height with the outer surface 30x of the first insulating layer 30 such that their surface constitute the identical surface.

With the above, a wiring substrate 2 of the second embodiment is obtained. The wiring substrate 2 of the second embodiment can achieve the similar advantages to the wiring substrate 1 (FIG. 2A) of the first embodiment.

Figure 12:
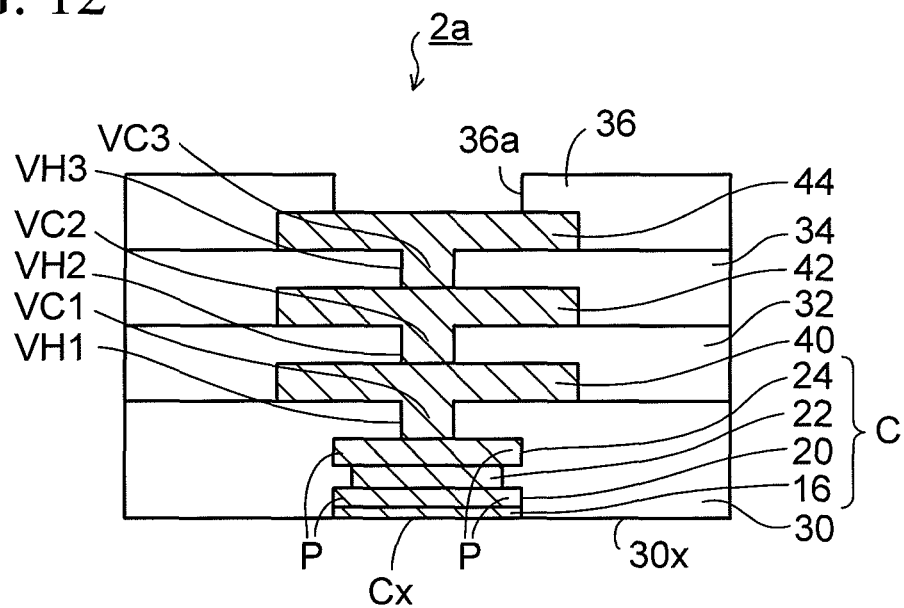
FIG. 12 is a sectional view depicting a wiring substrate according to a first variation of the second embodiment.

In FIG. 12, a wiring substrate 2a according to a first variation of the second embodiment is depicted. As depicted in FIG. 12, in the wiring substrate 2 in FIG. 11B, like the wiring substrate 1a of the first variation of the first embodiment, the peripheral parts of the first and second copper layers 20, 24 (the first and second metal layers) may constitute the protrusion portion P which protrudes to the outside than the outer edge part of the nickel layer 22 (the intermediate metal layer). In this case, instead of side-etching the first and second copper layers 20, 24, the nickel layer 22 may be side-etched.

Figure 13:
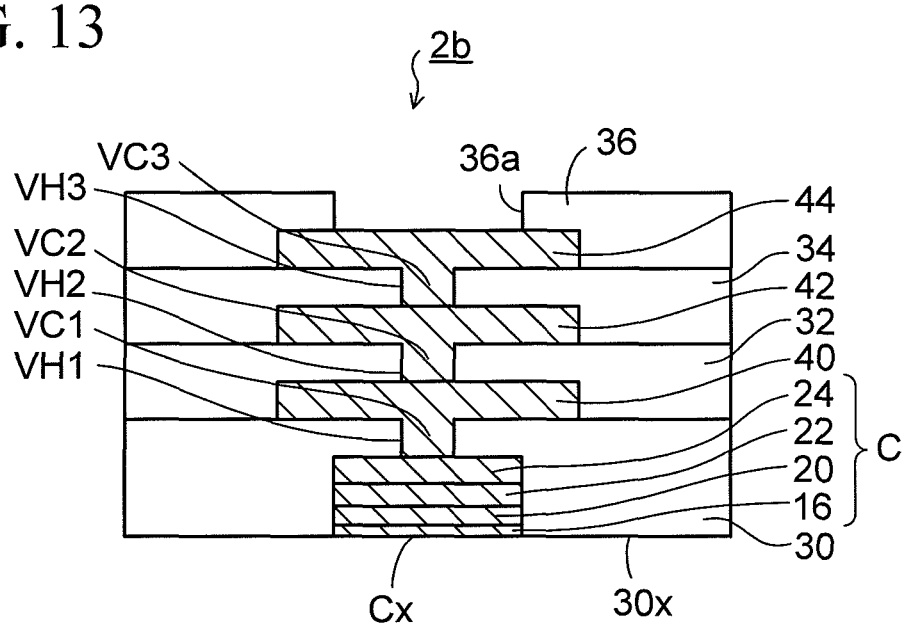
FIG. 13 is a sectional view depicting a wiring substrate according to a second variation of the second embodiment.

In FIG. 13, a wiring substrate 2b according to a second variation of the second embodiment is depicted. As depicted in FIG. 13, in the wiring substrate 2 in FIG. 11B, like the wiring substrate 1b of the second variation of the first embodiment, the side surface of the connection pad C may be shaped into the straight shape. In this case, the step of side-etching the first and second copper layers 20, 24 or the nickel layer 22 may be omitted.

(Second Method of Manufacturing the Wiring Substrate According to the Second Embodiment)

FIG. 14A to FIG. 15C are sectional views depicting a second method of manufacturing the wiring substrate according to the second embodiment. A feature of the second method of manufacturing the wiring substrate according to the second embodiment resides in that the nickel layer is formed on the whole surface of the copper plate 10 as the etching stop layer in removing the copper plate 10, and the pocket plating layer 14 and the surface treatment layer 16 are omitted.

Figure 14A:
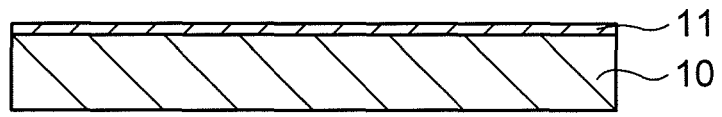
FIGS. 14A to 14D are sectional views (#1) depicting a second method of manufacturing the wiring substrate according to the second embodiment.
Figure 14B:
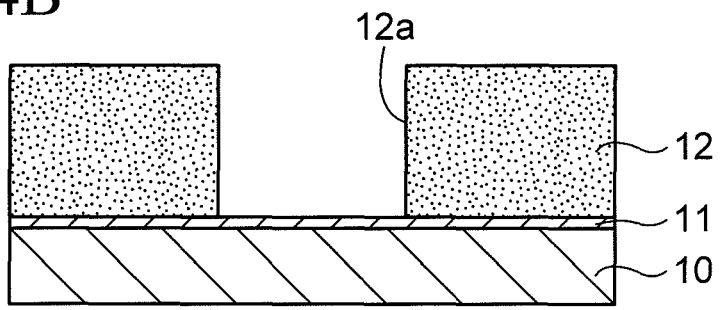

In the second method of manufacturing the wiring substrate according to the second embodiment, as depicted in FIG. 14A, an etching stop nickel layer 11 whose thickness is 0.5 to 5 μm is formed on the whole surface of the copper plate 10 by the electroplating, or the like. Then, as depicted in FIG. 14B, the resist 12 in which the opening portion 12a is provided in the portion where the connection pad is arranged is formed on the etching stop nickel layer 11.

Figure 14C:
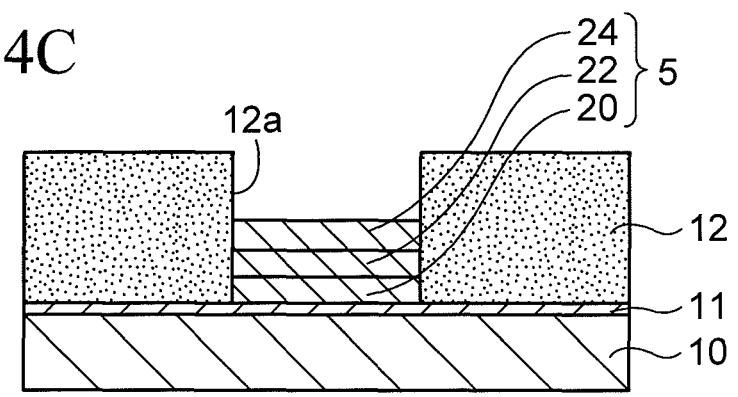

Then, as depicted in FIG. 14C, the first copper layer 20 (the first metal layer), the nickel layer 22 (the intermediate metal layer), and the second copper layer 24 (the second metal layer) are formed in sequence on the etching stop nickel layer 1 in the opening portion 12a in the resist 12 by the electroplating, but the pocket plating layer 14 and the surface treatment layer 16 formed in the first embodiment are omitted herein. Thus, the metal laminated portion 5 is obtained. In the second manufacturing method, the metal laminated portion 5 becomes the connection pad without change.

Figure 14D:
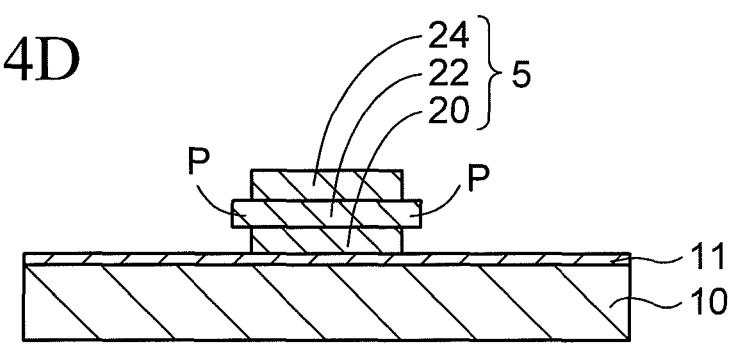

Then, as depicted in FIG. 14D, like the first embodiment, the resist 12 is removed, and the surfaces of the first and second copper layers 20, 24 are roughened. Then, the first copper layer 20 and the second copper layer 24 are wet-etched selectively to the nickel layer 22 and the etching stop nickel layer 11 by the SPM, and thus the peripheral part of the nickel layer 22 is formed as the protrusion portion P.

Figure 15A:
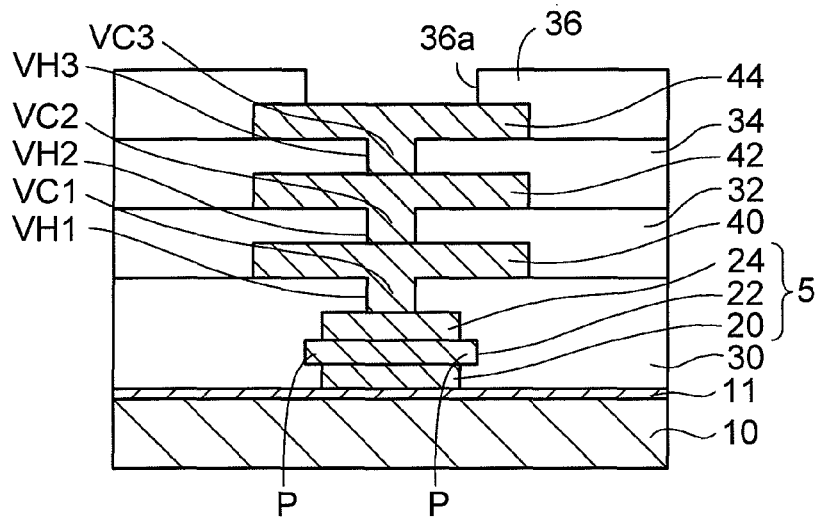
FIGS. 15A to 15C are sectional views (#2) depicting the second method of manufacturing the wiring substrate according to the second embodiment.

Then, the same steps as those in FIG. 7A to FIG. 8B in the first embodiment are applied to a structure in FIG. 14D. Thus, a structure in FIG. 15A is obtained.

Figure 15B:
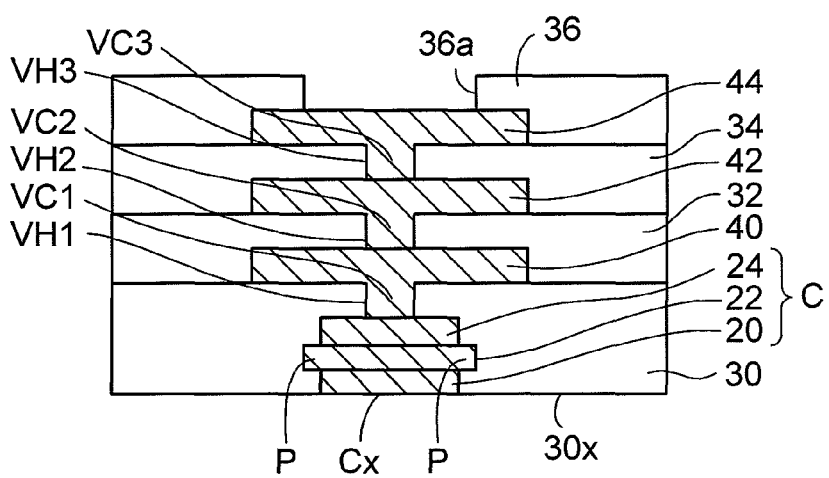

Then, as depicted in FIG. 15B, the copper plate 10 is etched selectively to the etching stop nickel layer 11 by the SPM, or the alkaline etchant, or the like and is removed, and then the exposed etching stop nickel layer 11 is etched selectively to the first copper layer 20 of the connection pad C by the NPM and is removed.

Accordingly, the connection pad C is obtained from the metal laminated portion 5, and the lower surface of the first copper layer 20 of the connection pad C is exposed. Then, the connection surface Cx of the connection pad C is arranged in the identical height position with the outer surface 30x of the first insulating layer 30 such that their surfaces constitute the identical surface.

In this manner, instead of the surface treatment layer 16 (the gold layer/the nickel layer, or the like), the etching stop nickel layer 11 is formed on the copper plate 10, and thus the first copper layer 20 of the connection pad C can be exposed not to cause the corrosion.

As shown in FIG. 15B, the resultant substrate may be employed as the wiring substrate in a state that the first copper layer 20 (the first metal layer) of the connection pad C is exposed.

Figure 15C:
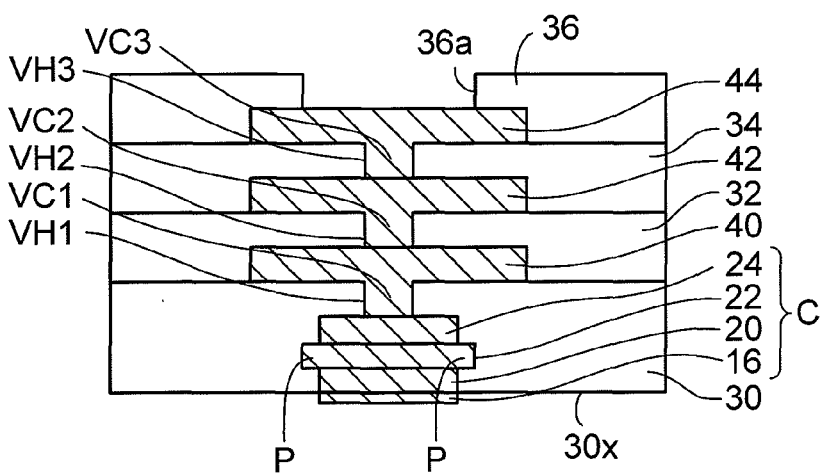

Alternately, as depicted in FIG. 15C, like FIG. 10C in the first embodiment, the contact layer (the nickel layer/the gold layer, the nickel layer/the palladium layer/the gold layer, the palladium layer/the gold layer, the gold layer, or the tin layer, or the like) may be formed on the exposed surface of the first copper layer 20 of the connection pad C by the electroless plating, or the like, and may be employed as the surface treatment layer 16. Otherwise, the antioxidizing agent (OSP) may be formed, and employed as the surface treatment layer 16.

In FIGS. 15B and 15C, other elements are similar to those in FIG. 2A in the first embodiment, and therefore their explanation will be omitted herein.

Third Embodiment

A feature of a wiring substrate according to a third embodiment resides in that, in the wiring substrate 1 in FIG. 2A in the first embodiment, the connection pad C is formed as the bump electrode which protrudes from the outer surface 30x of the first insulating layer 30 to the outside.

In the third embodiment, detailed explanations about the same elements and the same steps as those in the first embodiment will be omitted herein.

(First Method of Manufacturing a Wiring Substrate According to a Third Embodiment)

FIG. 16A to FIG. 17C are sectional views depicting a first method of manufacturing a wiring substrate according to the third embodiment.

Figure 16A:
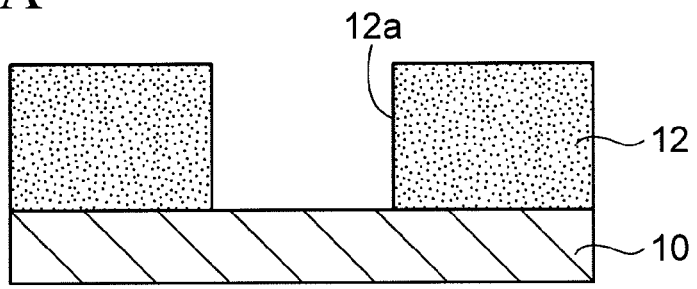
FIGS. 16A to 16D are sectional views (#1) depicting a first method of manufacturing a wiring substrate according to a third embodiment.

In the first method of manufacturing the wiring substrate of the third embodiment, as depicted in FIG. 16A, the resist 12 in which the opening portion 12a is provided in the part where the connection pad is arranged is formed on the copper plate 10.

Figure 16B:
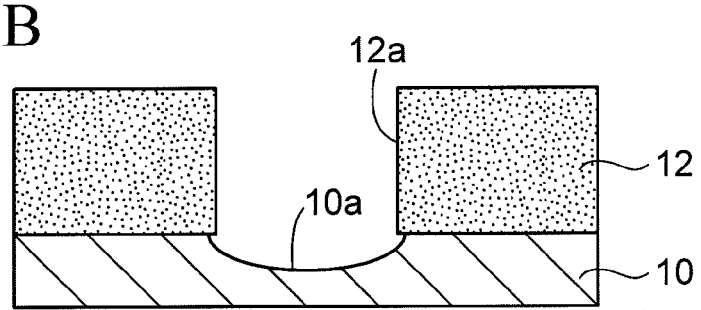

Then, as depicted in FIG. 16B, a concave portion 10a is formed by etching the copper plate 10 in the thickness direction through the opening portion 12a of the resist 12. The concave portion 10a of the copper plate 10 is provided so as to cause the connection pad to protrude as the bump electrode, and its depth is set to 5 to 50 μm. The concave portion 10a of the copper plate 10 is formed to protrude downward like a curved surface.

Figure 16C:
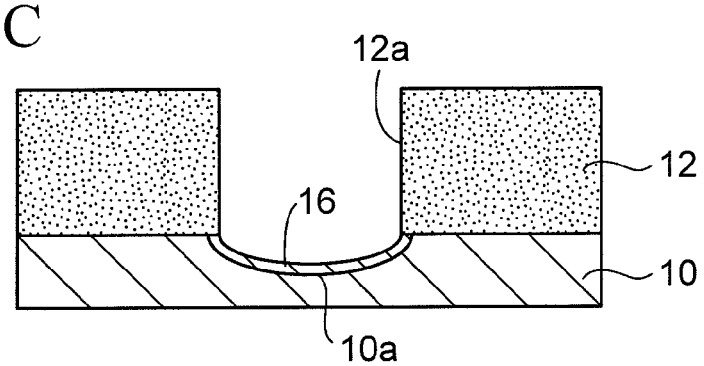

Then, as depicted in FIG. 16C, the surface treatment layer 16 is formed on the concave portion 10a of the copper plate 10 in the opening portion 12a of the resist 12 by the electroplating. Like the first embodiment, the surface treatment layer 16 is formed by the gold layer/the nickel layer, the gold layer/palladium layer/the nickel layer, or the tin layer, or the like in order from the bottom.

Figure 16D:
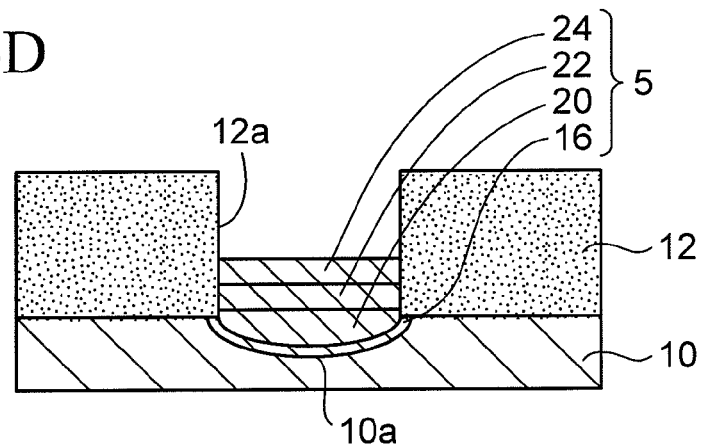

Then, as depicted in FIG. 16D, the first copper layer 20 (the first metal layer), the nickel layer 22 (the intermediate metal layer), and the second copper layer 24 (the second metal layer) are formed in order on the surface treatment layer 16 in the opening portion 12a of the resist 12 by the electroplating.

Accordingly, the metal laminated portion 5 which is constructed by the surface treatment layer 16, the first copper layer 20 (the first metal layer), the nickel layer 22 (the intermediate metal layer), and the second copper layer 24 (the second metal layer) is formed on the concave portion 10a of the copper plate 10 in the opening portion 12a of the resist 12. In the first manufacturing method, the metal laminated portion 5 is employed as the connection pad without change.

Figure 17A:
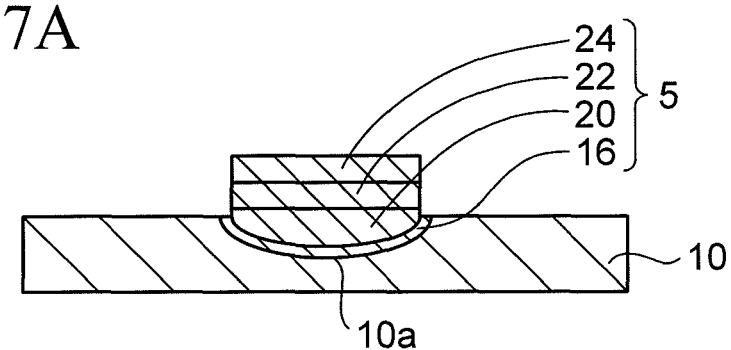
FIGS. 17A to 17C are sectional views (#2) depicting the first method of manufacturing the wiring substrate according to the third embodiment.

Then, as depicted in FIG. 17A, the metal laminated portion 5 is exposed by removing the resist 12 from the structure in FIG. 16D.

Figure 17B:
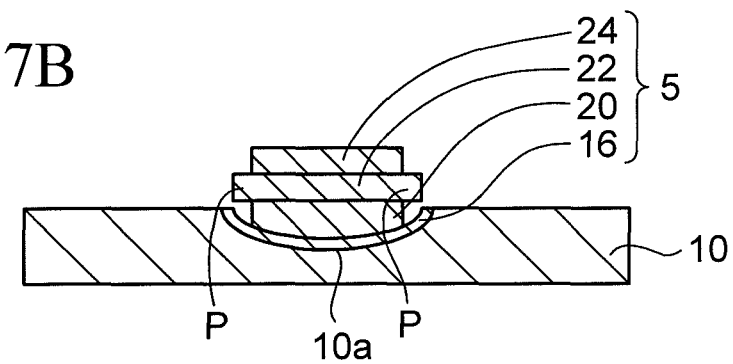

Then, as depicted in FIG. 17B, like the first embodiment, the surfaces of the first and second copper layers 20, 24 are roughened, and then the first copper layer 20 and the second copper layer 24 are wet-etched selectively to the nickel layer 22 by using the SPM. Accordingly, the peripheral part of the nickel layer 22 is formed as the protrusion portion P which protrudes from the outer edge parts of the first and second copper layers 20, 24 to the outside.

Then, the same steps as those in FIG. 7A to FIG. 8B in the first embodiment are applied to a structure in FIG. 17B. Thus, a structure in FIG. 17C is obtained.

Figure 17C:
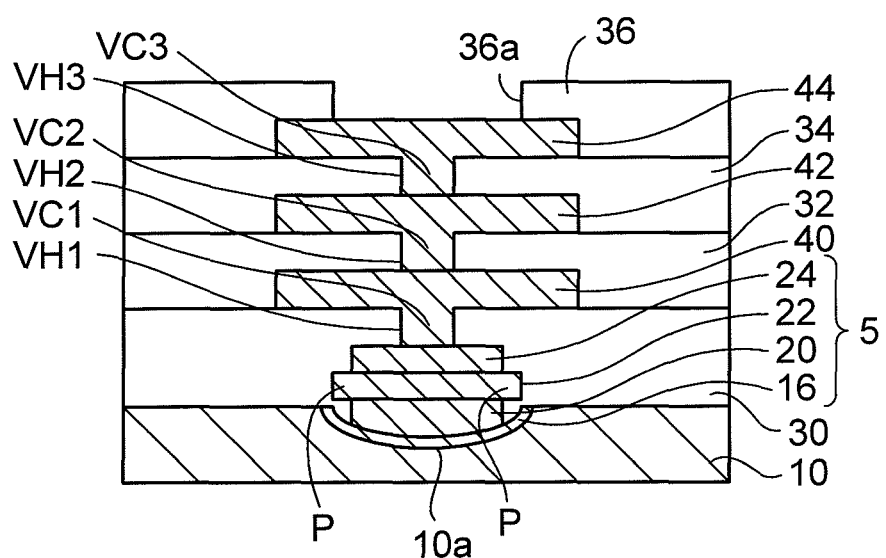
Figure 18:
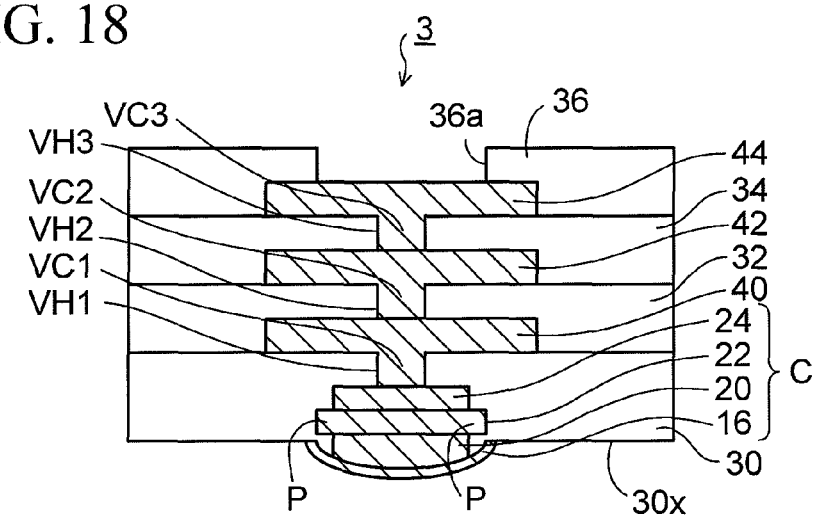
FIG. 18 is a sectional view depicting a wiring substrate according to a third embodiment.

Then, the copper plate 10 is removed from the structure in FIG. 17C by etching the copper plate 10 selectively to the surface treatment layer 16 (the lowermost layer is the gold layer) of the metal laminated portion 5 by using SPM. Accordingly, as depicted in FIG. 18, the metal laminated portion 5 constitutes the connection pad C, and the surface treatment layer 16 as the lowermost layer of the connection pad C is exposed. With the above, a wiring substrate 3 of the third embodiment can be obtained.

In the wiring substrate 3 of the third embodiment, the first copper layer 20 (the first metal layer) of the connection pad C is formed as the bump electrode which protrudes from the outer surface 30x of the first insulating layer 30 to the outside, and the surface treatment layer 16 is formed on the outer surface side of the first copper layer 20 (the first metal layer). The first copper layer 20 (the first metal layer) of the connection pad C is formed to protrude downward like a curved surface.

The wiring substrate 3 of the third embodiment can achieved the similar advantages as those of the wiring substrate 1 (FIG. 2A) in the first embodiment. In this case, the outer edge part of the surface treatment layer 16 may be arranged in the identical position with those of the first and second copper layers 20, 24 by side-etching the surface treatment layer 16 in the above step in FIG. 17B.

Figure 19:
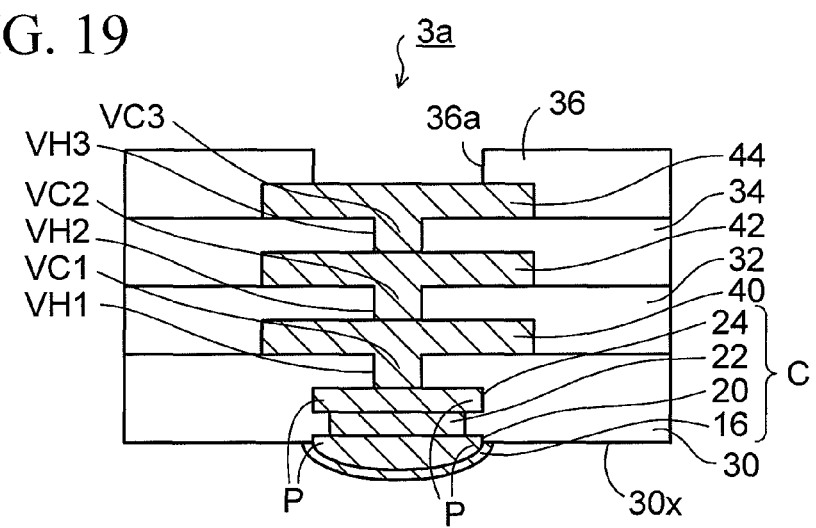
FIG. 19 is a sectional view depicting a wiring substrate according to a first variation of the third embodiment.

In FIG. 19, a wiring substrate 3a according to a first variation of the third embodiment is depicted. As depicted in FIG. 19, like the wiring substrate 1a of the first variation of the first embodiment, in the wiring substrate 3 in FIG. 18, the peripheral parts of the first copper layer 20 and the second copper layer 24 are formed as the protrusion portion P which protrude from the outer edge part of the nickel layer 22 to the outside.

In the case that the wiring substrate 3a of the first variation in FIG. 19 is manufactured, instead of side-etching the first and second copper layers 20, 24, by side-etching the nickel layer 22 in the above steps in FIG. 17B, the peripheral parts of the first and second copper layers 20, 24 may be formed as the protrusion portion P.

Figure 20:
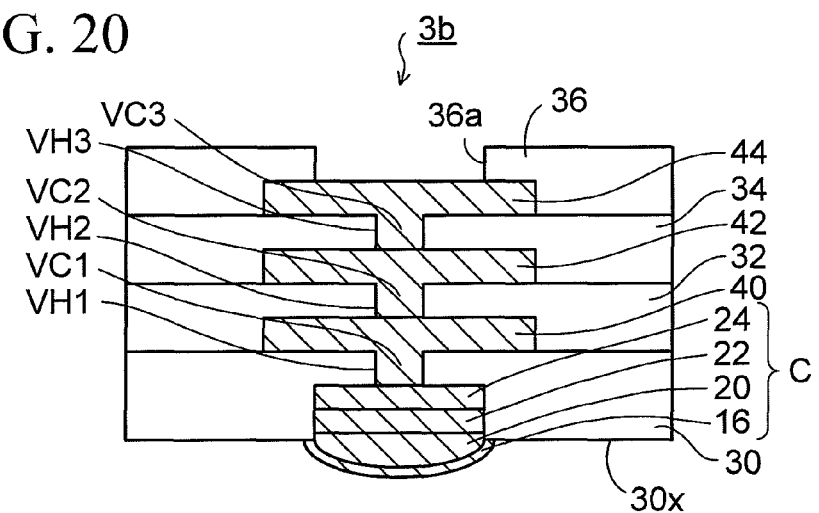
FIG. 20 is a sectional view depicting a wiring substrate according to a second variation of the third embodiment.

In FIG. 20, a wiring substrate 3b according to a second variation of the third embodiment is depicted. As depicted in FIG. 20, like the wiring substrate 1b of the second variation of the first embodiment, in the wiring substrate 3 in FIG. 18, the first and second copper layers 20, 24 and the nickel layer 22 of the connection pad C may be formed to have the identical area, and thus the side surface of the connection pad C may be formed as the straight shape.

In the case that the wiring substrate 3b of the second variation in FIG. 20 is manufactured, in FIG. 17B mentioned above, the side-etching step applied to the first and second copper layers 20, 24, or the nickel layer 22 may be omitted.

(Second Method of Manufacturing a Wiring Substrate According to the Third Embodiment)

FIG. 21A to FIG. 23B are sectional views depicting a second method of manufacturing the wiring substrate according to the third embodiment. A feature of the second method of manufacturing the wiring substrate according to the third embodiment resides in that, in the above first method of manufacturing the wiring substrate according to the third embodiment, the etching stop nickel layer is formed instead of the surface treatment layer 16, on the concave portion 10a of the copper plate 10 in the opening portion 12a of the resist 12.

Figure 21A:
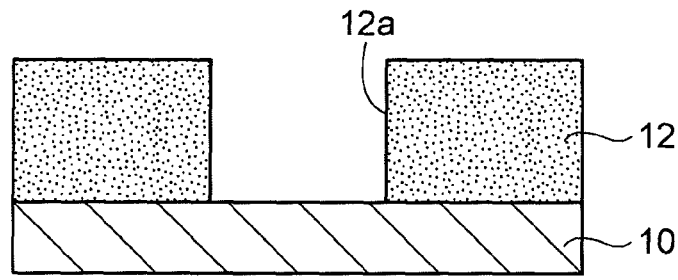
FIGS. 21A to 21D are sectional views (#1) depicting a second method of manufacturing a wiring substrate according to the third embodiment.
Figure 21B:
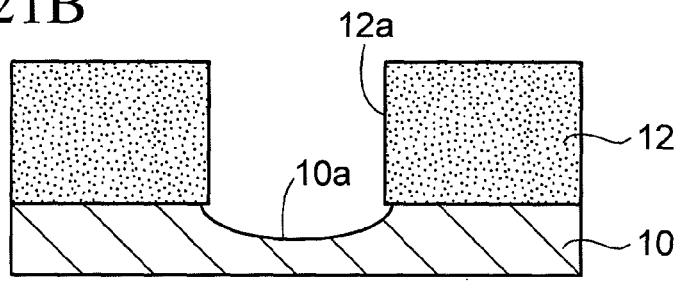

As depicted in FIGS. 21A and 21B, like the above first method of manufacturing the wiring substrate according to the third embodiment, the resist 12 in which the opening portion 12a is provided is formed on the copper plate 10, and then the concave portion 10a is formed to the copper plate 10 in the opening portion 12a of the resist 12.

Figure 21C:
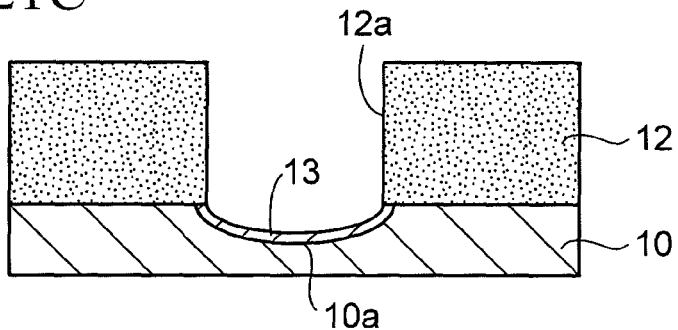
Figure 21D:
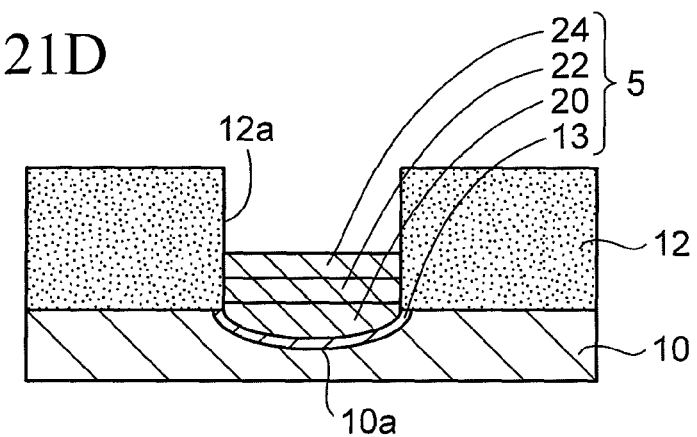

Then, as depicted in FIG. 21C, instead of the surface treatment layer 16, an etching stop nickel layer 13 is formed on the inner surface of the concave portion 10a of the copper plate 10 by the electroplating. Then, as depicted in FIG. 21D, the first copper layer 20 (the first metal layer), the nickel layer 22 (the intermediate metal layer), and the second copper layer 24 (second metal layer) are formed in sequence on the etching stop nickel layer 13 in the opening portion 12a of the resist 12 by the electroplating.

Accordingly, the metal laminated portion 5 which is constructed by the etching stop nickel layer 13, the first copper layer 20 (the first metal layer), the nickel layer 22 (the intermediate metal layer), and the second copper layer 24 (second metal layer) is formed on the concave portion 10a of the copper plate 10 in the opening portion 12a of the resist 12. In the second manufacturing method, the first copper layer 20, the nickel layer 22, and the second copper layer 24 out of the metal laminated portion 5 constitute the connection pad.

Figure 22A:
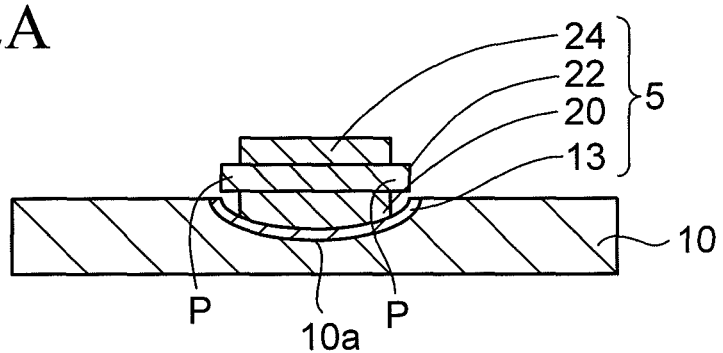
FIGS. 22A to 22C are sectional views (#2) depicting the second method of manufacturing the wiring substrate according to the third embodiment.
Figure 22B:
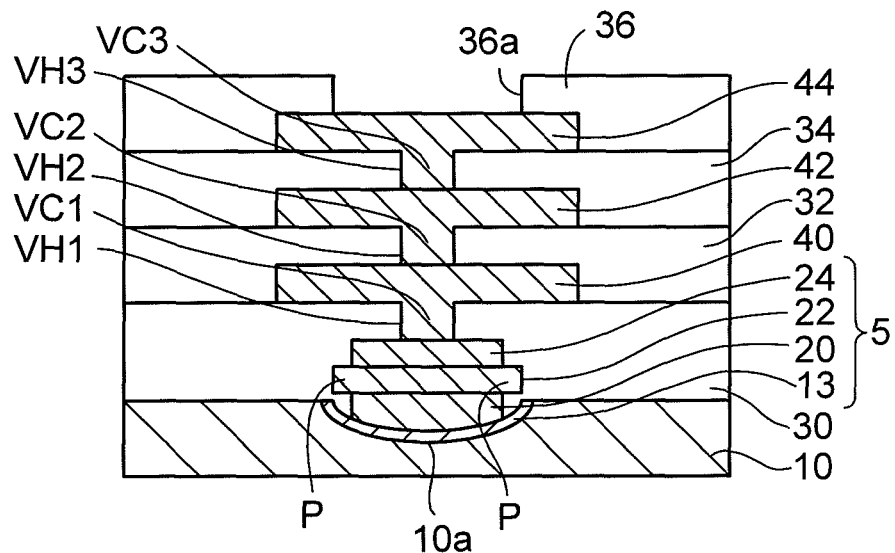

Then, as depicted in FIG. 22A, the resist 12 is removed, and the surfaces of the first and second copper layers 20, 24 are roughened. Then, the first and second copper layers 20, 24 are wet-etched selectively to the nickel layer 22 by using the SPM. Thus, the peripheral part of the nickel layer 22 is formed as the protrusion portion P which protrudes from the outer edge parts of the first and second copper layers 20, 24 to the outside. Then, the same steps as those in FIG. 7A to FIG. 8B in the first embodiment are applied to a structure in FIG. 22A, and thus a structure depicted in FIG. 22B is obtained.

Figure 22C:
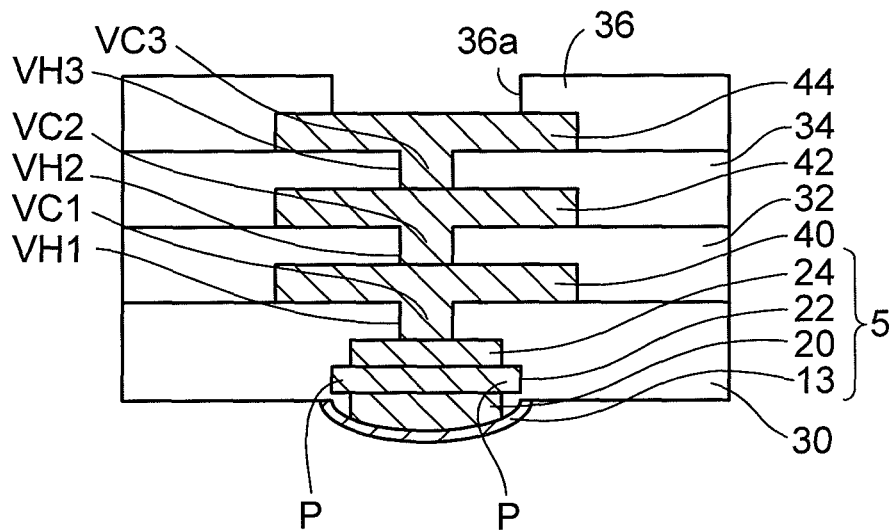

Then, as depicted in FIG. 22C, the copper plate 10 is etched selectively to the etching stop nickel layer 13 by the SPM and is removed.

Figure 23A:
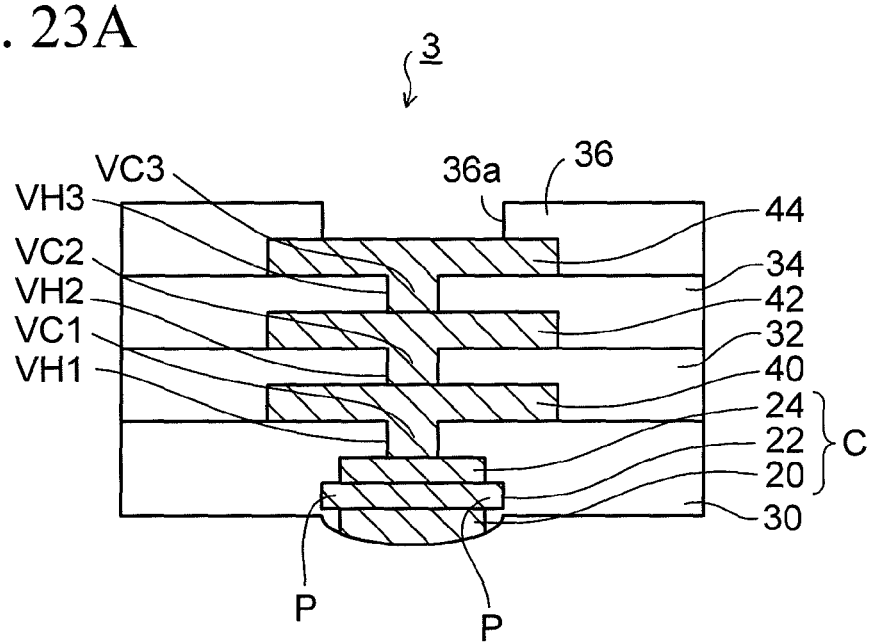
FIGS. 23A and 23B are sectional views (#3) depicting the second method of manufacturing the wiring substrate according to the third embodiment.

Then, as depicted in FIG. 23A, the etching stop nickel layer 13 is etched selectively to the first copper layer 20 by using the NPM and is removed. Accordingly, the connection pad C is obtained, and the lower surface of the first copper layer 20 thereof is exposed.

In this fashion, the etching stop nickel layer 13 is formed in place of the surface treatment layer 16 (the Ni layer/the gold layer, or the like). Therefore, the first copper layer 20 (the first metal layer) of the connection pad C can be exposed not to cause the corrosion.

In this manner, the first copper layer 20 (the first metal layer) of the connection pad C is formed as the bump electrode which protrudes from the outer surface 30x of the first insulating layer 30 to the outside.

As depicted in FIG. 23A, the resultant substrate may be employed as the wiring substrate 3 of the third embodiment in a state that the first copper layer 20 (the first metal layer) of the connection pad C is exposed.

Figure 23B:
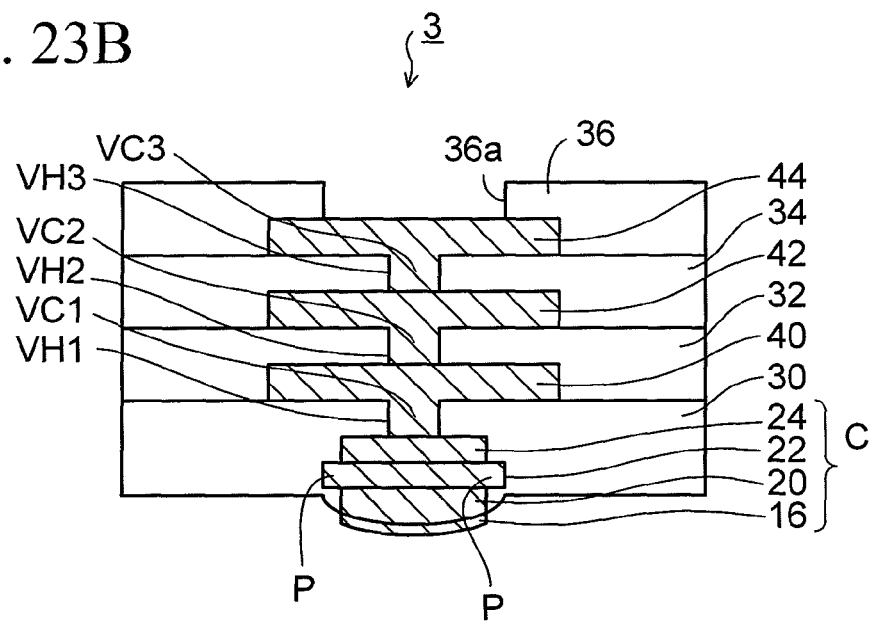

Otherwise, as in the wiring substrate 3 in FIG. 23B, like FIG. 10C in the first embodiment, the contact layer (the nickel layer/the gold layer, the nickel layer/the palladium layer/the gold layer, the palladium layer/the gold layer, the gold layer, or the tin layer, or the like) may be formed on the exposed surface of the first copper layer 20 of the connection pad C by the electroless plating, or the like, and be employed as the surface treatment layer 16. Alternatively, the antioxidizing agent (OSP) may be formed, and be employed as the surface treatment layer 16.

In FIGS. 23A and 23B, other elements are similar to those in FIG. 2A, and therefore their explanations will be omitted herein.

All examples and conditional language recited herein are intended for pedagogical purpose to aid the reader in understanding the invention and the concepts contributed by the inventor to furthering the art, and are to be construed as being without limitation to such specifically recited examples and conditions, nor does the organization of such examples in the specification relates to a showing of the superiority and interiority of the invention. Although the embodiments of the present invention have been described in detail, it should be understood that the various changes, substitutions, and alterations could be made hereto without departing from the spirit and scope of the invention.

What is claimed is:

1. A wiring substrate, comprising:
   an insulating layer;
   a wiring layer buried in the insulating layer; and
   a connection pad connected to the wiring layer via a via conductor provided in the insulating layer, and in which a whole of a side surface of the connection pad except a connection surface is buried in an outer surface side of the insulating layer;
   wherein the connection pad includes a first metal layer arranged on the outer surface side, an intermediate metal layer arranged on a surface of an inner layer side of the first metal layer, and a second metal layer arranged on a surface of an inner layer side of the intermediate metal layer, and a hardness of the intermediate metal layer is higher than a hardness of the first metal layer and the second metal layer, and
   a peripheral part of the intermediate metal layer is formed as a protrusion portion protruding from outer edge parts of the first metal layer and the second metal layer to an outside, and the protrusion portion is provided along outer edges of the first and second metal layer,
   and the connection pad is arranged in a bottom surface of a concave portion of the insulating layer, and a diameter of the concave portion is the same as the diameter of the intermediate metal layer.

2. A wiring substrate according to claim 1, wherein the first metal layer and the second metal layer are formed of copper respectively, and the intermediate metal layer is formed of any one of nickel, palladium, chromium, iron, molybdenum, and manganese.

3. A wiring substrate according to claim 1, wherein the connection pad includes a surface treatment layer formed on a surface of an outer layer side of the first metal layer, and the surface treatment layer is formed of any one of a gold layer/a nickel layer in order from an outer side, a gold layer/a palladium layer/a nickel layer in order from an outer side, a gold layer/a palladium layer in order from an outer side, a gold layer, a tin layer, and an antioxidizing agent.

4. A wiring substrate according to claim 1, wherein the wiring substrate is a coreless wiring substrate having no core substrate, and the insulating layer functions as a substrate.

5. A wiring substrate, comprising:
   an insulating layer;
   a wiring layer buried in the insulating layer; and
   a connection pad connected to the wiring layer via a via conductor provided in the insulating layer, and in which at least a part of the connection pad is buried in an outer surface side of the insulating layer which is formed as a surface layer of the wiring substrate;
   wherein the connection pad includes a surface treatment layer arranged on the outer surface side, a first metal layer arranged on a surface of an inner layer side of the surface treatment layer, an intermediate metal layer arranged on a surface of an inner layer side of the first metal layer, and a second metal layer arranged on a surface of an inner layer side of the intermediate metal layer, and
   a side surface and a surface of the second metal layer side in the connection pad contact the insulating layer, and a surface of the surface treatment layer side in the connection pad is exposed on the surface of the wiring substrate,
   and the second metal layer has a roughened surface, and a tip of the via conductor is connected to the roughened surface, and
   a hardness of the intermediate metal layer is higher than a hardness of the first metal layer and the second metal layer,
   and the connection pad is arranged in a bottom surface of a concave portion of the insulating layer, and a diameter of the concave portion is the same as the diameter of the intermediate metal layer.

6. A wiring substrate according to claim 5, wherein the first metal layer and the second metal layer are formed of copper respectively, and the intermediate metal layer is formed of any one of nickel, palladium, chromium, iron, molybdenum, and manganese.

7. A wiring substrate according to claim 5, wherein the surface treatment layer is formed of any one of a gold layer/a nickel layer in order from an outer side, a gold layer/a palladium layer/a nickel layer in order from an outer side, a gold layer/a palladium layer in order from an outer side, a gold layer, a tin, layer, and an antioxidizing agent.

8. A wiring substrate according to claim 5, wherein the wiring substrate is a coreless wiring substrate having no core substrate, and the insulating layer functions as a substrate.

* * * * *